United States Patent
Yamazaki et al.

(10) Patent No.: US 7,736,955 B2
(45) Date of Patent: *Jun. 15, 2010

(54) MANUFACTURE METHOD OF DISPLAY DEVICE BY USING DROPLET DISCHARGE METHOD

(75) Inventors: Shunpei Yamazaki, Tokyo (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 196 days.

This patent is subject to a terminal disclaimer.

(21) Appl. No.: 11/650,565

(22) Filed: Jan. 8, 2007

(65) Prior Publication Data
US 2007/0172972 A1 Jul. 26, 2007

Related U.S. Application Data

(63) Continuation of application No. 10/771,155, filed on Feb. 4, 2004, now Pat. No. 7,176,069.

(30) Foreign Application Priority Data

Feb. 5, 2003 (JP) ............................. 2003-028924

(51) Int. Cl.
*H01L 21/84* (2006.01)
(52) U.S. Cl. .................. 438/151; 438/30; 257/E21.412
(58) Field of Classification Search .................. 118/720; 156/345.3; 257/E21.412; 438/30, 149, 151, 438/488, 674, 694
See application file for complete search history.

(56) References Cited

U.S. PATENT DOCUMENTS

| 4,328,257 | A | | 5/1982 | Muehlberger et al. |
| 5,238,523 | A | * | 8/1993 | Yuasa et al. .................. 156/517 |
| 5,429,994 | A | | 7/1995 | Ishikawa |
| 5,483,082 | A | | 1/1996 | Takizawa et al. |

(Continued)

FOREIGN PATENT DOCUMENTS

EP 1 071 117 A2 1/2001

(Continued)

OTHER PUBLICATIONS

Wolf, S. et al., "Silicon Processing for the VLSI ERA", vol. 1, pp. 198, 408, 427, 539, 542, 535, Jan. 1, 1986.

(Continued)

*Primary Examiner*—Matthew C Landau
*Assistant Examiner*—Daren Wolverton
(74) *Attorney, Agent, or Firm*—Nixon Peabody LLP; Jeffrey L. Costellia

(57) ABSTRACT

It is an object of the present invention to reduce the consumption of materials for manufacturing a display device, simplify the manufacturing process and the apparatus used for it, and lower the manufacturing costs. The present invention provides a technique to manufacture a display device, applying a means to form a pattern such as a contact hole formed in a semiconductor film, a wiring or an insulating film, or a mask pattern to form such a pattern by drawing directly, a means to remove a film, such as etching and ashing, and a film forming means to selectively form an insulating film, a semiconductor film and a metal film on a predetermined region.

50 Claims, 16 Drawing Sheets

U.S. PATENT DOCUMENTS

| | | | |
|---|---|---|---|
| 5,549,780 A | 8/1996 | Koinuma et al. | |
| 5,563,095 A | 10/1996 | Frey | |
| 5,580,796 A | 12/1996 | Takizawa et al. | |
| 5,679,167 A | 10/1997 | Muehlberger | |
| 5,824,361 A | 10/1998 | Asanuma | |
| 6,019,850 A * | 2/2000 | Frey | 118/719 |
| 6,051,150 A | 4/2000 | Miyakawa | |
| 6,118,502 A * | 9/2000 | Yamazaki et al. | 349/45 |
| 6,203,619 B1 | 3/2001 | McMillan | |
| 6,228,465 B1 | 5/2001 | Takiguchi et al. | |
| 6,231,917 B1 * | 5/2001 | Ito et al. | 427/9 |
| 6,293,222 B1 * | 9/2001 | Paquet | 118/723 ME |
| 6,312,502 B1 * | 11/2001 | Li et al. | 95/45 |
| 6,416,583 B1 | 7/2002 | Kitano et al. | |
| 6,424,091 B1 * | 7/2002 | Sawada et al. | 315/111.81 |
| 6,429,400 B1 | 8/2002 | Sawada et al. | |
| 6,627,263 B2 | 9/2003 | Kitano et al. | |
| 6,660,545 B2 | 12/2003 | Furusawa | |
| 6,756,324 B1 * | 6/2004 | Gates | 438/791 |
| 6,767,473 B2 | 7/2004 | Fujita et al. | |
| 6,776,880 B1 | 8/2004 | Yamazaki | |
| 6,782,928 B2 * | 8/2004 | Kweon et al. | 141/192 |
| 6,808,749 B2 | 10/2004 | Morii et al. | |
| 6,871,943 B2 | 3/2005 | Ogawa | |
| 6,885,032 B2 * | 4/2005 | Forbes et al. | 257/72 |
| 6,909,477 B1 | 6/2005 | Yi et al. | |
| 7,115,434 B2 | 10/2006 | Yamazaki et al. | |
| 7,176,069 B2 * | 2/2007 | Yamazaki et al. | 438/149 |
| 7,189,654 B2 | 3/2007 | Yamazaki et al. | |
| 2001/0002331 A1 | 5/2001 | Miyata | |
| 2001/0003601 A1 | 6/2001 | Ueda et al. | |
| 2001/0004190 A1 | 6/2001 | Nishi et al. | |
| 2001/0027013 A1 | 10/2001 | Tsutsui | |
| 2002/0022364 A1 | 2/2002 | Hatta et al. | |
| 2002/0050599 A1 * | 5/2002 | Lee et al. | 257/88 |
| 2002/0067400 A1 | 6/2002 | Kawase et al. | |
| 2002/0105080 A1 * | 8/2002 | Speakman | 257/749 |
| 2002/0109143 A1 | 8/2002 | Inoue | |
| 2002/0128515 A1 | 9/2002 | Ishida et al. | |
| 2002/0151171 A1 | 10/2002 | Furusawa | |
| 2003/0054653 A1 | 3/2003 | Yamazaki et al. | |
| 2003/0059975 A1 | 3/2003 | Sirringhaus et al. | |
| 2003/0059984 A1 | 3/2003 | Sirringhaus et al. | |
| 2003/0059987 A1 | 3/2003 | Sirringhaus et al. | |
| 2003/0060038 A1 | 3/2003 | Sirringhaus et al. | |
| 2003/0132987 A1 | 7/2003 | Ogawa | |
| 2003/0177639 A1 * | 9/2003 | Berg | 29/847 |
| 2004/0050685 A1 | 3/2004 | Yara et al. | |
| 2004/0075396 A1 | 4/2004 | Okumura et al. | |
| 2004/0253896 A1 | 12/2004 | Yamazaki | |
| 2004/0266073 A1 | 12/2004 | Yamazaki | |
| 2005/0011752 A1 | 1/2005 | Yamazaki | |
| 2005/0013927 A1 | 1/2005 | Yamazaki | |
| 2005/0064091 A1 | 3/2005 | Yamazaki | |
| 2005/0090029 A1 | 4/2005 | Yamazaki et al. | |
| 2005/0167404 A1 | 8/2005 | Yamazaki | |
| 2007/0015323 A1 | 1/2007 | Isobe et al. | |
| 2007/0167023 A1 | 7/2007 | Yamazaki et al. | |
| 2008/0206915 A1 | 8/2008 | Yamazaki | |

FOREIGN PATENT DOCUMENTS

| | | |
|---|---|---|
| EP | 1 253 626 A2 | 10/2002 |
| EP | 1340838 | 9/2003 |
| JP | 06-202153 | 7/1994 |
| JP | 06-327924 | 11/1994 |
| JP | 07-024579 | 1/1995 |
| JP | 08-203868 | 8/1996 |
| JP | 09-320363 | 12/1997 |
| JP | 10-062814 | 3/1998 |
| JP | 11-168042 | 6/1999 |
| JP | 11-274671 | 10/1999 |
| JP | 11-340129 | 12/1999 |
| JP | 2000-157899 A | 6/2000 |
| JP | 2000-169977 | 6/2000 |
| JP | 2000-188251 A | 7/2000 |
| JP | 2000-328269 | 11/2000 |
| JP | 2001-068827 | 3/2001 |
| JP | 2001-68827 | 3/2001 |
| JP | 2001-093871 | 4/2001 |
| JP | 2001-0179167 | 7/2001 |
| JP | 2001-179167 | 7/2001 |
| JP | 2001-209073 | 8/2001 |
| JP | 2002-066391 | 3/2002 |
| JP | 2002-096474 A | 4/2002 |
| JP | 2002-151478 | 5/2002 |
| JP | 2002-237463 | 8/2002 |
| JP | 2002-237480 | 8/2002 |
| JP | 2002-289864 | 10/2002 |
| JP | 2002-324966 | 11/2002 |
| JP | 2002-324966 A | 11/2002 |
| JP | 2002-359246 | 12/2002 |
| JP | 2002-359347 | 12/2002 |
| JP | 2002-367774 | 12/2002 |
| JP | 2003-010755 A | 1/2003 |
| JP | 2003-017413 | 1/2003 |
| JP | 2003-126760 A | 5/2003 |
| JP | 2003-192499 A | 7/2003 |
| JP | 2003-212685 A | 7/2003 |
| JP | 2003-212686 A | 7/2003 |
| JP | 2003-238286 A | 8/2003 |
| JP | 2003-311197 | 11/2003 |
| JP | 2003-347284 | 12/2003 |
| WO | WO-01-47044 | 6/2001 |
| WO | WO-02-40742 | 5/2002 |
| WO | WO-2004/070809 | 8/2004 |
| WO | WO-2004/070811 | 8/2004 |
| WO | WO-2004/070819 | 8/2004 |
| WO | WO-2004/070820 | 8/2004 |
| WO | WO-2004-070821 | 8/2004 |
| WO | WO-2004-070822 | 8/2004 |
| WO | WO-2004-070823 | 8/2004 |

OTHER PUBLICATIONS

International Search Report (Application No. PCT/JP2004/000895) and Written Opinion dated Apr. 27, 2004 with partial translation of Written Opinion.
International Search Report (Application No. PCT/JP2004/000897) and Written Opinion dated Apr. 27, 2004 with partial translation of Written Opinion.
International Search Report (Application No. PCT/JP2004/000899) and Written Opinion dated Apr. 27, 2004 with partial translation of Written Opinion.
International Search Report (Application No. PCT/JP2004/000900) and Written Opinion dated Jun. 1, 2004 with partial translation of Written Opinion.
International Search Report (Application No. PCT/JP2004/000915) and Written Opinion dated Apr. 27, 2004 with partial translation of Written Opinion.
International Search Report (Application No. PCT/JP2004/000918) and Written Opinion dated Apr. 27, 2004 with partial translation of Written Opinion.
International Search Report (Application No. PCT/JP2004/000930) and Written Opinion dated Apr. 13, 2004 with partial translation of Written Opinion.
International Search Report (Application No. PCT/JP2004/000932) and Written Opinion dated Apr. 6, 2004 with partial translation of Written Opinion.

* cited by examiner

MANUFACTURE METHOD OF DISPLAY DEVICE BY USING DROPLET DISCHARGE METHOD

This application is a Continuation of U.S. application Ser. No. 10/771,155 now U.S. Pat. No. 7,176,069 B2, filed Feb. 4, 2004.

TECHNICAL FIELD

The present invention relates to a manufacturing method of a display device that displays images or the like with pixels arranged on a plane surface. Especially the present invention relates to a technique to manufacture the display device continuously using a flexible substrate.

BACKGROUND ART

Monitoring devices (liquid crystal monitors) for computers and television receivers (liquid crystal TV) are sold on the market as practical product examples of display devices (liquid crystal display devices) using electro-optical characteristics of liquid crystal.

The liquid crystal display device of active matrix type, which is the mainstream presently, has a pixel structure where a switching element that is called a thin film transistor (TFT) is provided for each pixel. The technique to manufacture such a display device is developed by combining a photolithography process using a photomask, and a film forming or etching process using vacuum equipment and the like properly, similar to a manufacturing technique of a semiconductor integrated circuit.

A manufacturing process like this includes a process in which a film of a conductive material, an insulator, a semiconductor film and the like is formed by sputtering or chemical vapor deposition (CVD), a process in which an intended pattern is made by soaking a resist film in a developing solution after applying a photosensitive resist film on the film and exposing it through a mask by using projection photolithography equipment, and a process in which etching is performed using a solution or an active reactive gas, with these processes combined and performed repeatedly.

DISCLOSURE OF INVENTION

Problem to be Solved by the Invention

For a conventional manufacturing technique of a display device, many kinds and large quantity of chemical materials including organic ones and inorganic ones are used. Especially, organic chemicals are used in large quantity for a photolithography process, so that considerable work and costs are needed for the waste liquid treatment. Specifically, approximately 95% of a resist composition is wasted when deposited by spin coating. That is, most of the materials are thrown away. Furthermore, large quantities of chemicals are consumed when developing and peeling treatments are performed. In addition, most of the films including a conductive material, an insulator and a semiconductor film formed on the entire surface of a substrate are removed by etching, and the percentage that a wiring or the like remains on the substrate is several to several dozen percent.

As is clear from the above, in the conventional manufacturing technique of a display device, most of the materials are thrown away, which increases environmental burdens, as well as affects the manufacturing costs. Such tendency has become obvious as the size of the substrates on production lines was enlarged.

In view of the above problems, the object of the present invention is to reduce the consumption of materials for manufacturing a display device, simplify the manufacturing process and the apparatus used for it, and lower the manufacturing costs.

Means for Solving the Problem

The present invention provides a technique to manufacture a display device, applying a means to form a pattern such as a contact hole formed in a semiconductor film, a wiring or an insulating film, or a mask pattern of a composition comprising a high molecular weight resin to form such a pattern by drawing directly, a means to remove a film, such as etching and ashing, and a film forming means to selectively form an insulating film, a semiconductor film and a metal film on a predetermined region.

That is, the present invention uses at least a pattern drawing means comprising a droplet discharging means where a plurality of discharge outlets for a composition is arranged in a uniaxial direction, a film removing means that changes a gas into plasma and removes a film with a plurality of discharging ports for the plasma formed by arranging in a uniaxial direction, and a film forming means that changes a gas into plasma and forms a film with a plurality of discharging ports for the plasma arranged in a uniaxial direction. And the present invention includes a step of forming a film such as an insulating film, a semiconductor film, a metal film and others by the film forming means, a step of forming a wiring pattern by drawing with a composition including a conductive material on a substrate by the pattern drawing means, a step of forming a mask pattern by drawing with a composition of a high molecular weight resin on the substrate by the pattern forming means, a step of etching that selectively removes the film formed on the substrate by the film removing means, and a step of removing the mask pattern comprising a high molecular weight resin by the film removing means.

In addition, the present invention includes a step of forming a pattern of a conductive film including a gate electrode, source and drain electrodes by a pattern drawing means comprising a droplet discharging means where a plurality of discharge outlets for a composition is arranged in a uniaxial direction, a step of forming a non-single crystal semiconductor film and an inorganic insulating film by a film forming means that changes a gas into plasma and forms a film with a plurality of discharging ports for the plasma arranged in a uniaxial direction, and a step of removing a part of the non-single crystal semiconductor film and/or the insulating film by a film removing means that changes a gas into plasma and removes the formed film with a plurality of discharging ports for the plasma arranged in a uniaxial direction.

Each process described above may be performed under an atmospheric pressure or a pressure around an atmospheric pressure. The atmospheric pressure or a pressure around the atmospheric pressure may be $1.3 \times 10^1$ to $1.06 \times 10^5$ Pa.

As for the pattern drawing means, a structure in which a composition is discharged using piezoelectric elements, as is the case with ink-jet, or a structure in which the dropping amount is controlled by setting a needle valve in a discharge outlet may be applied as the droplet discharging means comprising a discharge outlet for a composition.

As a composition to form a conductive pattern that functions as a wiring or the like, a conductive composition that includes metal microparticles whose size is approximately 1 μm, or a conductive polymer composition in which metal microparticles whose size is approximately 1 μm and ultrafine particles (nano particles) whose size is 1 μm or less are dispersed may be used.

The film forming means has a structure comprising a nozzle body where a plurality of discharging ports for a gas in a plasma state or a gas including reactive radicals or ion species is arranged in a uniaxial direction. Furthermore, the film removing means has a structure similar to this, and the structure can be used for the both cases by properly selecting a gas to be introduced therein. The representative reactive gas that is applied for the film forming means is a siliconized gas such as silane, and it can form a non-single crystal semiconductor film. In addition, by combining an oxide gas such as oxygen and nitrous oxide or a nitride gas such as nitrogen and ammonia with a siliconized gas, an insulating film of silicon oxide, silicon nitride or the like can be formed.

The representative reactive gases that are applied for the film removing means include a fluoride gas such as nitrogen trifluoride and sulfur hexafluoride, and a chloride gas such as chlorine and boron trichloride. By using these gasses, etching of various films including a semiconductor film can be performed.

Effect of the Invention

As described above, a display device can be formed on a flexible substrate without using a photomask. Furthermore, in the processes of the present invention, each of the process to form a film, the process to form a wiring pattern, the etching process, the process to remove a mask pattern can be performed under an atmospheric pressure or a pressure around an atmospheric pressure respectively.

BEST MODE FOR CARRYING OUT THE INVENTION

An embodiment mode of the present invention will be described in detail with reference to drawings. The present invention, especially, uses a method in which a substrate having flexibility is sent from one side to the other side continuously and predetermined processing treatments are conducted therebetween. That is, a substrate having flexibility is winded off from a roll in one side and sent to a roll in the other side to be reeled, which means the so-called roll-to-roll method process is performed.

Figure 4A:
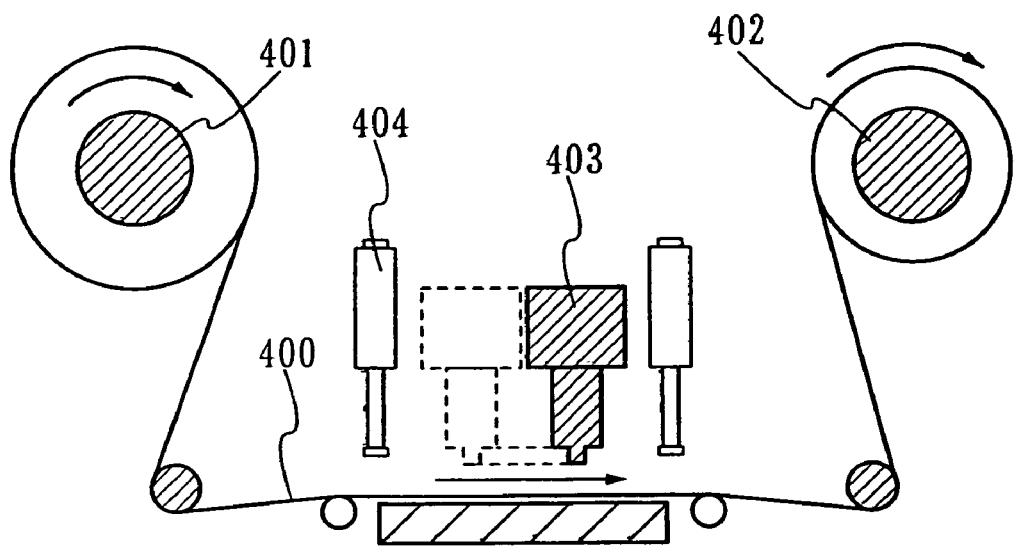
FIG. 4A and FIG. 4B are diagrams to show an example of a pattern drawing means of the present invention.
Figure 4B:
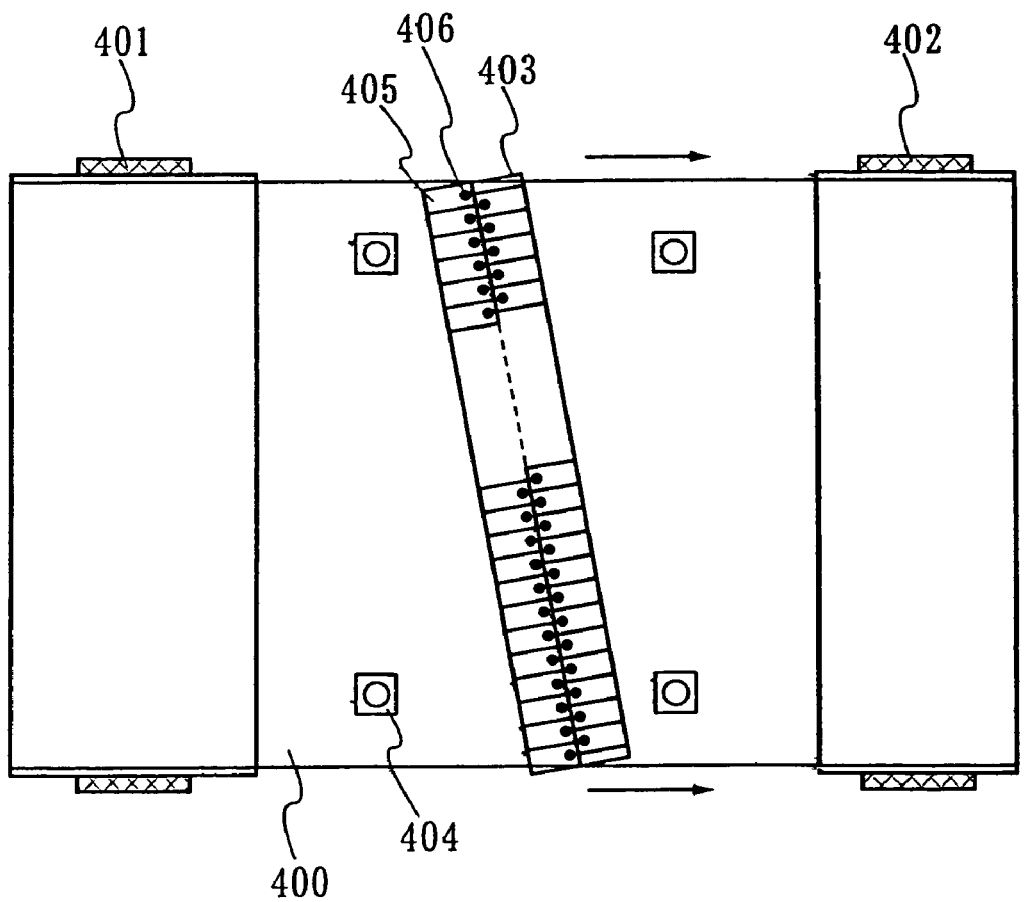

An aspect of a pattern drawing means of the present invention will be described using FIG. 4A and FIG. 4B. A droplet discharging means 403 is provided to discharge a composition on a flexible substrate 400 while the flexible substrate 400 is sent from one roll 401 to the other roll 402 to be reeled. This droplet discharging means 403 uses a plurality of heads 405 respectively having a discharge outlet 406, arranged in a uniaxial direction (in a direction parallel to the width of the flexible substrate 400). An imaging means 404 is provided to detect a marker position on the flexible substrate 400 or to observe a pattern. FIG. 4A is a schematic diagram viewed from the side, and FIG. 4B is a schematic diagram viewed from the top.

The droplet discharging means 403 where discharge outlets 406 are arranged in a uniaxial direction is placed so as to intersect with the direction in which the flexible substrate 400 is delivered. The angle formed by the droplet discharging means 403 and the direction in which the substrate is delivered is not necessarily perpendicular. The droplet discharging means 403 and the direction in which the substrate is delivered may intersect each other at an angle of 45 to 90 degrees. The resolution of a pattern formed by this droplet discharging means 403 depends on the pitch of the discharge outlets 406. By setting the angle formed by the droplet discharging means 403 and the direction in which the flexible substrate 400 is delivered 90 degrees or smaller, the pitch of the discharge outlets can be narrowed substantially, which is preferable for forming a microscopic pattern.

The head 405 of the droplet discharging means 403 can preferably control the amount and timing of a composition which is discharged or dropped, and it may have a structure in which the composition is discharged using piezoelectric elements as is the case with ink-jet, or a structure in which the dropping amount is controlled by setting a needle valve in a discharge outlet.

It is not necessary for the heads 405 which constitute the droplet discharging means 403 to perform their discharge operation at the same timing. By controlling the timing of each head 405 discharging a composition in accordance with the movement of the flexible substrate 400, a pattern by the objected composition can be formed.

Figure 5:
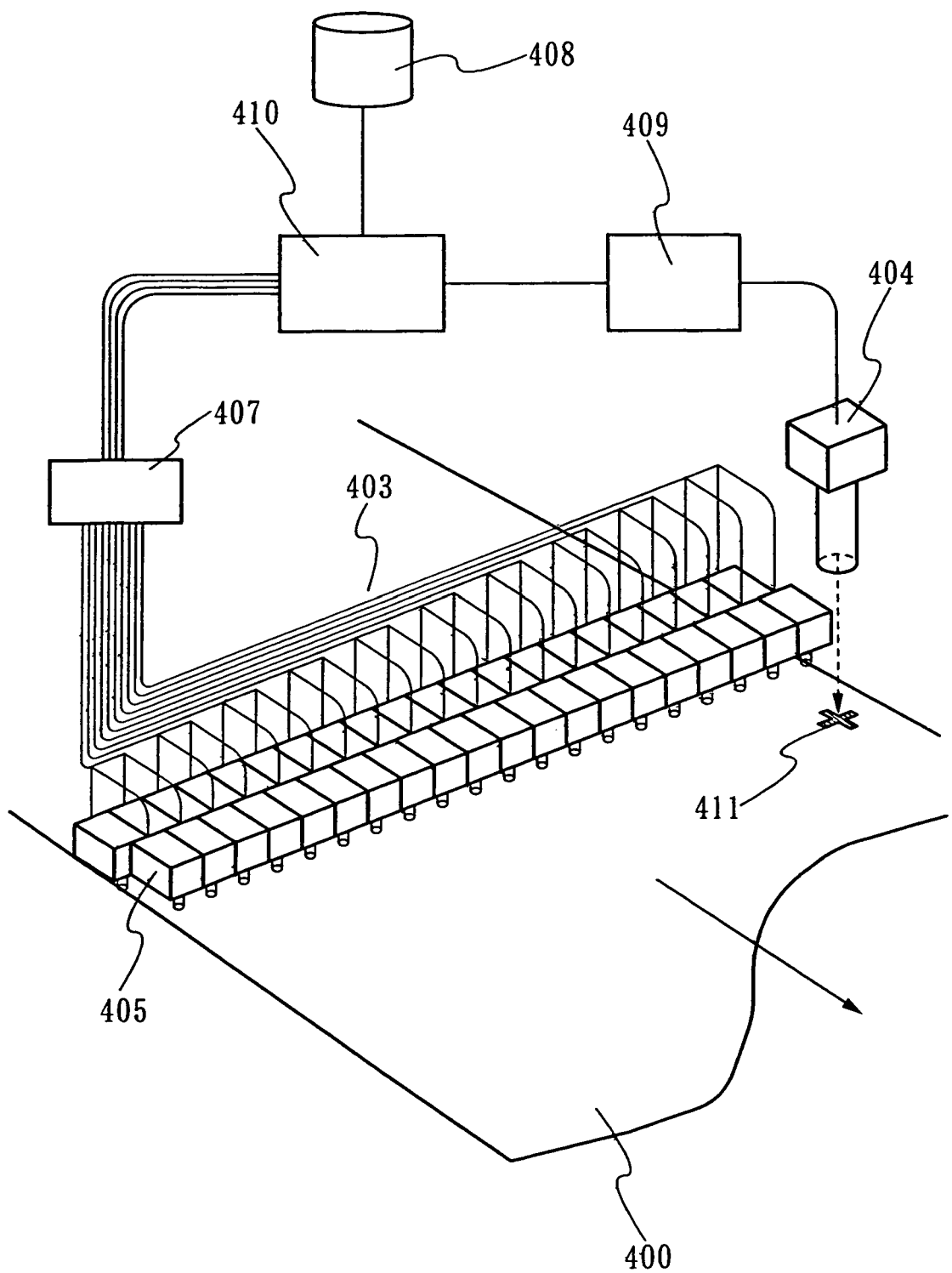
FIG. 5 is a diagram to show an example of a pattern drawing means of the present invention.

That is, as shown in FIG. 5, each head 405 of the droplet discharging means 403 is connected to a controlling means 407, and that is controlled by a computer 410 so that a pre-programmed pattern can be drawn. The timing of drawing may be based on a marker 411 that is formed on the flexible substrate 400, for example. That is detected by an imaging 404, and changed into a digital signal at an image treatment means 409. Then the digital signal is recognized by the computer 410 that generates a control signal, and the control signal is sent to the controlling means 407. Of course, information of the pattern to be formed on the flexible substrate 400 is stored in a storage medium 408, and a control signal is sent to the controlling means 407, based on the information, so that each head 405 of the droplet discharging means 403 can be controlled separately.

Figure 6A:
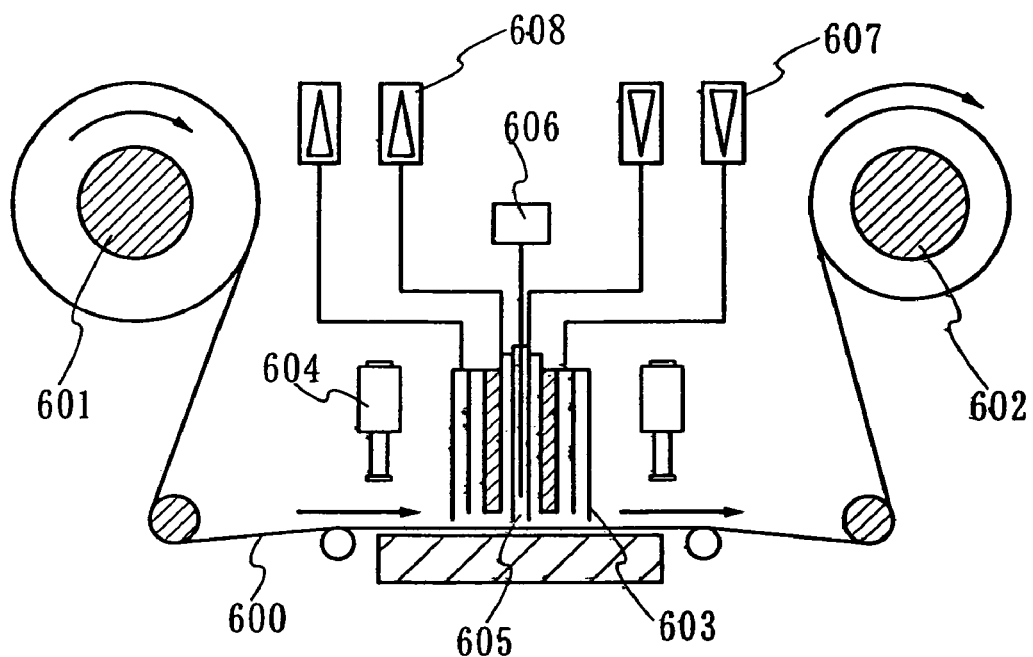
FIG. 6A and FIG. 6B are diagrams to show an example of a film forming means or a film removing means of the present invention.
Figure 6B:
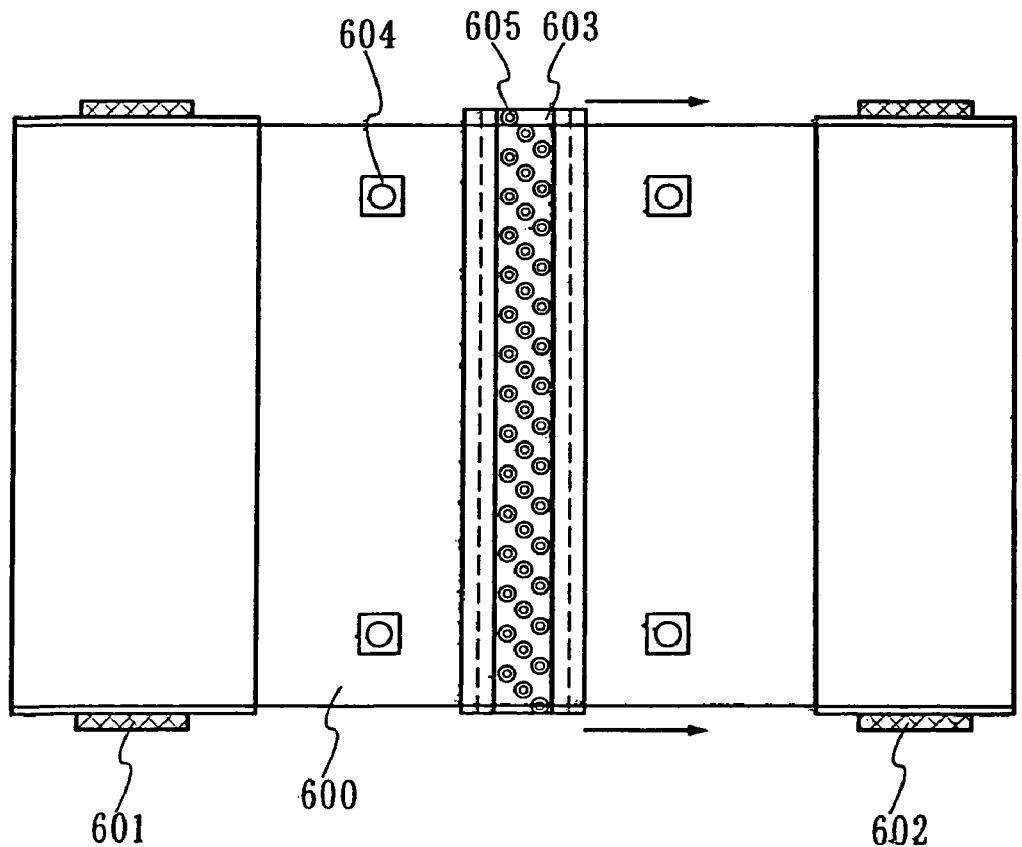

FIG. 6A and FIG. 6B are diagrams to show an aspect of a film removing means that comprises a nozzle body where a plurality of discharging ports for a gas in a plasma state or a gas including reactive radicals or ion species is arranged in a uniaxial direction to remove a film. A nozzle body 603 that comprises a plurality of discharging ports 605 that spout the above-mentioned reactive gas while a flexible substrate 600 is sent from a roll 601 in one side to a roll 602 in the other side to be reeled is provided. A plasma generating means 606, a gas supplying means 607 and a gas evacuation means 608 are connected to each exhaust-nozzle 605 in the nozzle body 603.

In this case, as is the case with the example shown in FIG. 5, each nozzle body 603 can be controlled independently by a computer, and can perform a predetermined treatment spouting a reactive gas selectively for a predetermined region in the flexible substrate 600, based on the image information (positional information) by an imaging 604. That is, as for removal of a film, as is the case with a dry etching technique, a film can be removed selectively, by blowing active radicals or a reactive gas so that reaction proceeds at that portion of the film.

When the film is a polymer composition as typified by a photoresist material, the so-called ashing treatment to remove the composition can be performed by using a gas that includes oxygen.

Furthermore, when a siliconized gas as typified by silane or the like is selected, deposition of a film is possible, and it can be applied as a film forming means. For example, a siliconized gas typified by silane may be used for forming a non-single crystal silicon film. When a siliconized gas is mixed with an oxygenated gas such as nitrous oxide or a nitride gas, a silicon oxide film or a silicon nitride film can be formed.

Figure 7:
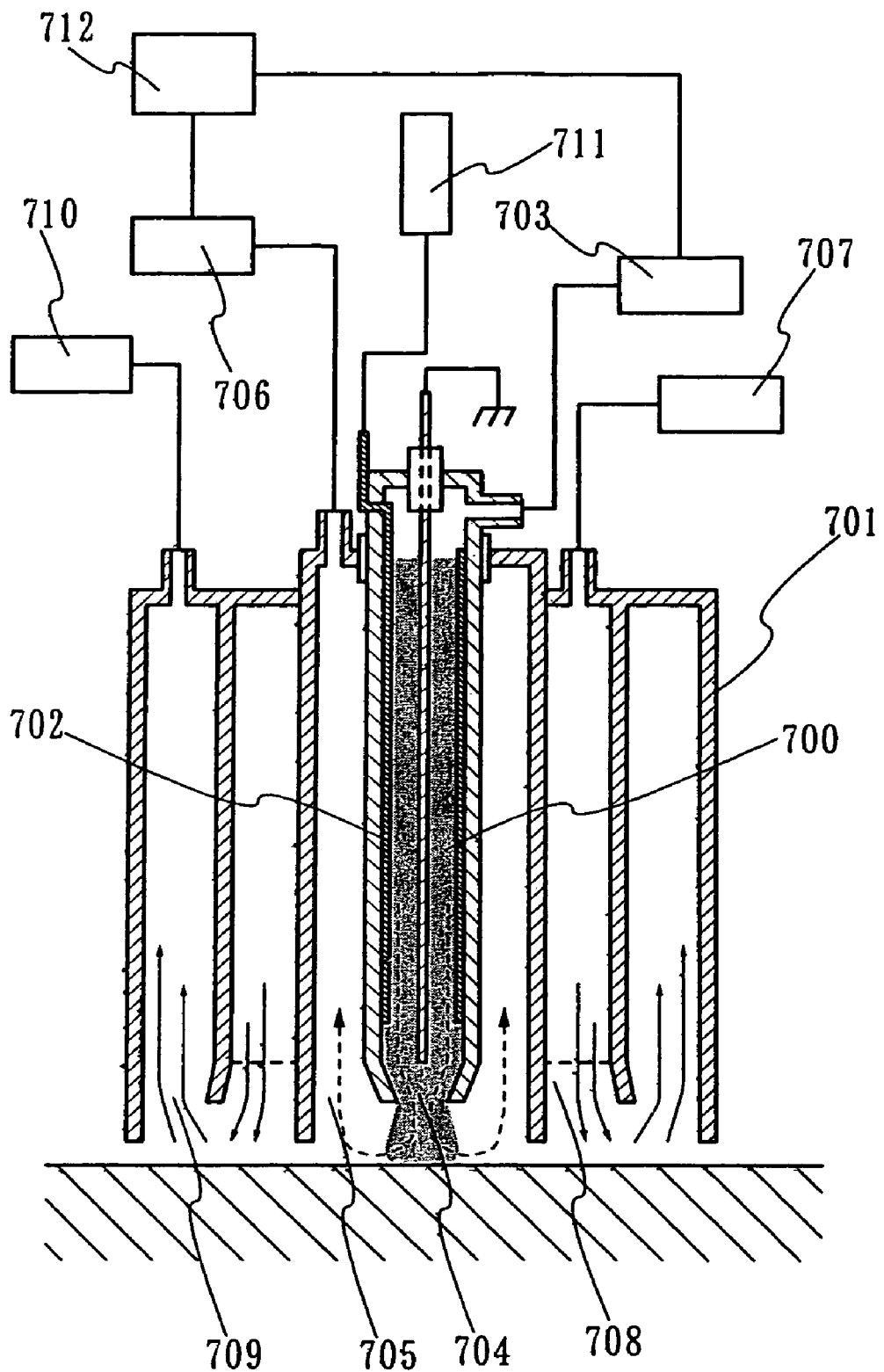
FIG. 7 is a diagram to show a structure of a nozzle body for a film forming means or a film removing means of the present invention.

FIG. 7 shows a structure of a nozzle body that is especially suitable for performing a surface treatment such as etching and ashing (removal of a resist film) by using a gas in a plasma state, reactive radicals or ion species. A gas supplying means 703 that supplies a gas for performing a surface treatment such as etching and ashing, a gas evacuation means 706 for that gas, an inert gas supplying means 707 and an evacuation means 710 for that gas are connected to a nozzle body 701. The gas supplied from the gas supplying means 703 is changed into plasma or generates reactive radicals or ion species in an inner circumference gas supplying tube 700, then is blown from a gas exhaust-nozzle 704 to an object to be treated. After that, the gas is evacuated from an outer circumference gas evacuation tube 705 by the gas evacuation means 706.

In the outer side of that, an inert gas supplying port 708 is provided, and an evacuation port 709 is provided in the outermost part so that a gas curtain is made, which forms a structure in which a treatment space is blocked from the circumferential atmosphere.

Furthermore, a structure in which a gas is circulated may be incorporated by providing a gas purification means 712 between the gas supplying means 703 and the gas evacuation means 706. By incorporating such a structure, the consumption of a gas can be reduced. In addition, the gas evacuated by the gas evacuation means 706 may be recovered and purified so as to be used in the gas supplying means 703 again.

In order to maintain a stable discharge under an atmospheric pressure or a pressure around an atmospheric pressure, a space between the nozzle body 701 and an object to be treated may be 50 mm or less, preferably 10 mm or less, and more preferably, 5 mm or less.

It is the most preferable that the shape of the nozzle body is an coaxial cylinder having an electrode 702, which is placed inside the inner circumference gas supplying tube 700, as the center, but as long as it has a structure in which a treatment gas in a plasma state can be supplied locally in a similar way, it is not limited to this.

As the electrode 702, stainless-steel, brass, or other alloy, and aluminum, nickel, or other metal of elemental substances may be used, and it may be formed in the shape of a stick, a sphere, a flat plate, a tube or the like. As for a power supply 711 that supplies electric power to the electrode 702, a direct-current power source or a high frequency power source can be applied. In the case of using a direct-current power source, it is preferable to supply an electric power intermittently to stabilize the discharge, and it is preferable to set the frequency from 50 Hz to 100 kHz, and the pulse duration time 1 to 1000 μsec.

As for a selection of a treatment gas, oxygen may be used for the purpose of removing a resist. For the purpose of etching of a semiconductor film such as silicon, nitrogen trifluoride ($NF_3$), sulfur hexafluoride ($SF_6$), or other fluoride gas may be used, and for the purpose of etching metals such as aluminum, titanium and tungsten, carbon tetrafluoride ($CF_4$), sulfur hexafluoride ($SF_6$), or other fluoride gas may be used properly combined with chloride ($Cl_2$), boron trichloride ($BCl_3$), or other chloride gas. Furthermore, in order to maintain the discharge stably, these fluoride gases and chloride gases may be used diluted by a rare gas such as helium, argon, krypton, and xenon.

As for a gas used for forming a gas curtain, a rare gas such as helium, argon, krypton and xenon, or an inert gas such as nitrogen is used. Due to the gas curtain function, a reaction space where a treatment gas in a plasma state reacts with an object to be treated is surrounded by the foregoing inert gas and blocked from the circumferential atmosphere.

An atmospheric pressure or a pressure around an atmospheric pressure may be $1.3 \times 10^1$ to $1.06 \times 10^5$ Pa. Within this, in order to keep the reaction space under a pressure lower than the atmospheric pressure, the nozzle body 701 and the substrate to be treated may be hold in a reaction chamber where a closed space is made, with a structure in which reduced pressure is kept by an evacuation means. In this case, too, setting a gas curtain function is effective to perform a selective treatment.

Figure 8:
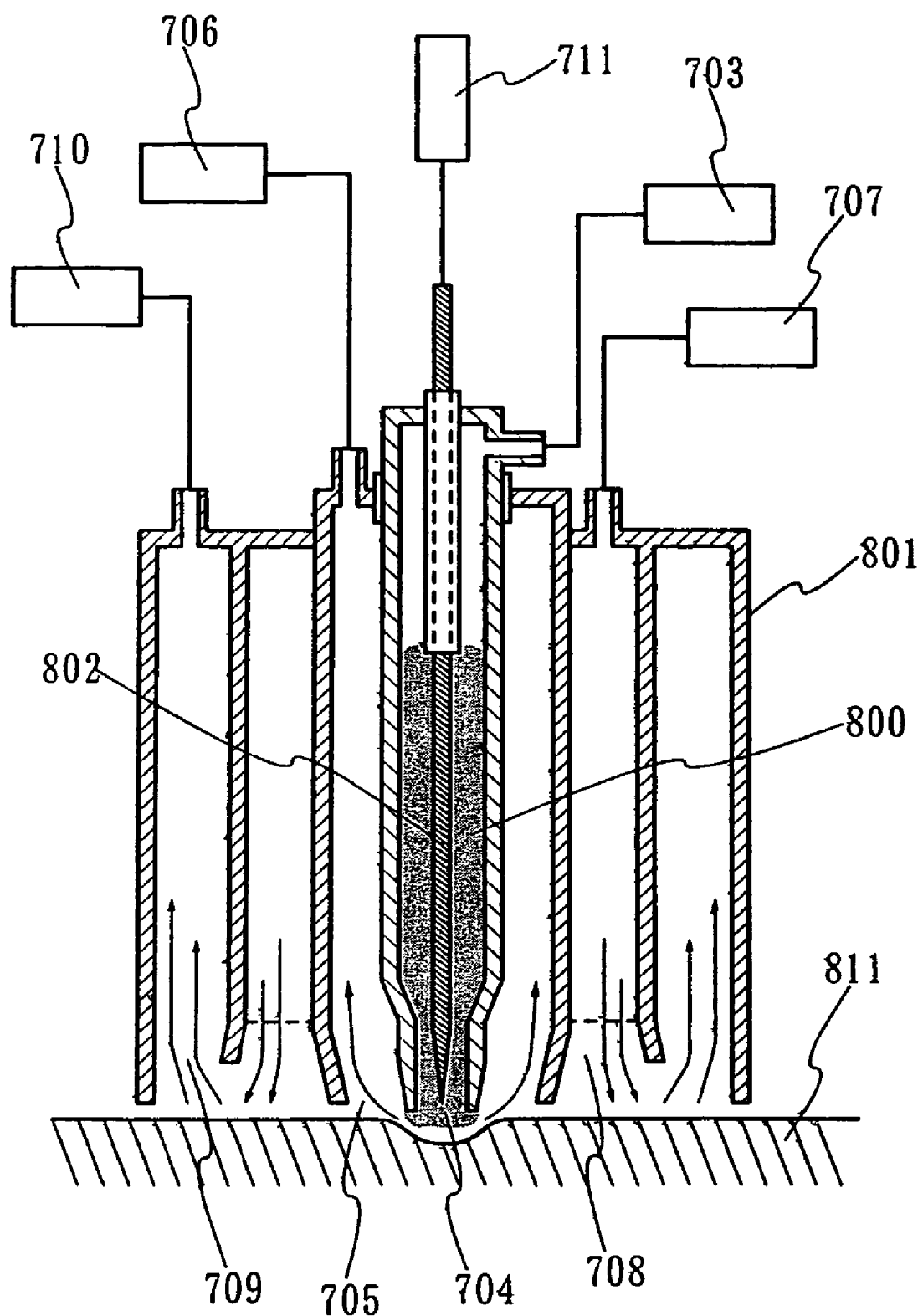
FIG. 8 is a diagram to show a structure of a nozzle body for a film forming means or a film removing means of the present invention.

In the case where especially selective processing is needed for etching, a nozzle body 801 may have a structure in which a gas exhaust-nozzle 704 of an inner circumference gas supplying tube 800 is narrowed and an electrode 802 is in the shape of a stick or a needle so that plasma is prevented from spreading, as shown in FIG. 8. Furthermore, a tip of the electrode 802 may protrude from the gas exhaust-nozzle 704 so that high-density plasma is formed between an object to be treated 811 and the gas exhaust-nozzle 704. The other structure is similar to FIG. 7, and the detailed description is skipped here.

Next, a method of manufacturing a display device from a long sheet of flexible substrate by combining the foregoing pattern drawing means, film removing means and film forming means will be described, with reference to FIG. 9 to FIG. 12. The display device shown here as an example is a display device of an active matrix type in which TFT is provided for each pixel.

Figure 9A:
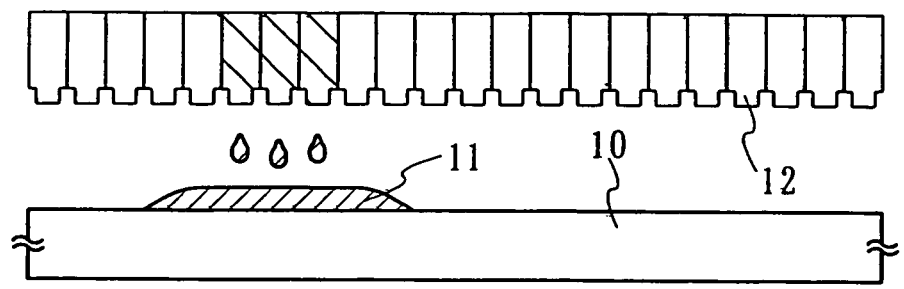
FIG. 9A to FIG. 9D are sectional views to describe a manufacturing process of a display device of the present invention.

FIG. 9A is a process to form a conductive film to form a gate electrode and a wiring. A conductive film 11 comprising aluminum, titanium, tantalum, molybdenum or the like is formed on a substrate 10 by a film forming means 12 comprising a nozzle body where a plurality of discharging ports for plasma is arranged in a uniaxial direction. It is not necessary to form the conductive film 11 on the entire surface of the substrate 10, and the film may be selectively formed around a region where a gate electrode and a wiring are to be formed.

Figure 9B:
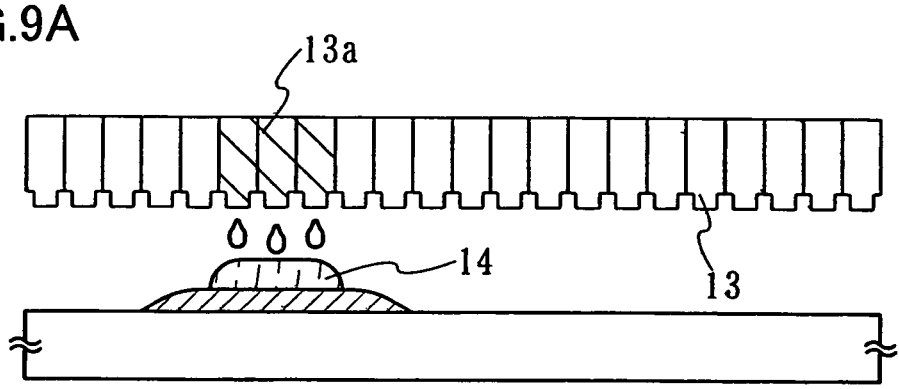

After that, as shown in FIG. 9B, a mask pattern 14 to form a gate electrode is formed on the conductive film 11 by selectively discharging a resist composition using a droplet discharging means 13 where a plurality of discharge outlets for a composition is arranged in a uniaxial direction. In this case, since the droplet discharging means has discharge outlets arranged only in a uniaxial direction, heads only in a needed part may be operated (head 13A). In order to treat the entire surface of the substrate, either one of the substrate 10 and the droplet discharging means 13, or both of the two may be moved. Such a treatment can be applied as well in the processes below.

Figure 9C:
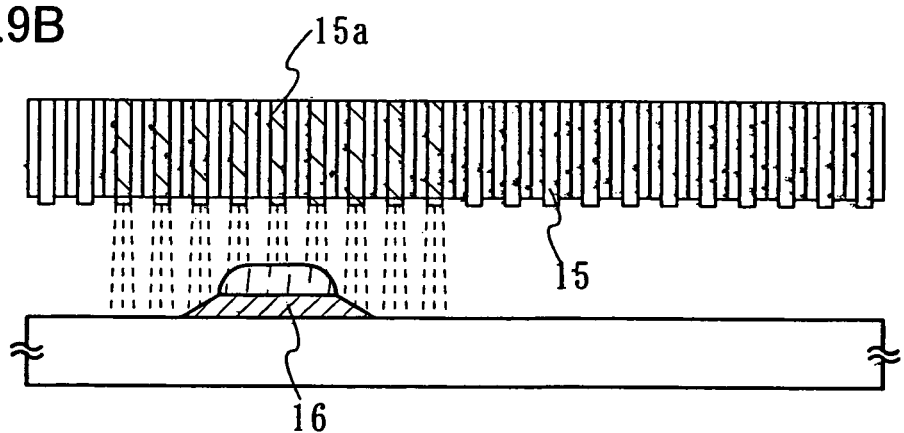

FIG. 9C is a process to form a gate electrode and a wiring 16 by performing etching, using the mask pattern 14. The etching is performed by using a film removing means where a plurality of discharging ports for plasma is arranged in a uniaxial direction to remove a film. Although a fluoride gas or a chloride gas is used for the etching of the conductive film 11, in a nozzle body 15, it is not necessary that the reactive gas is sprayed to the entire surface of the substrate 10. A nozzle body 15a of the nozzle body 15, which faces a region where the conductive film 11 is formed, may be operated so that only the region where the conductive film 11 is formed is treated.

Figure 9D:
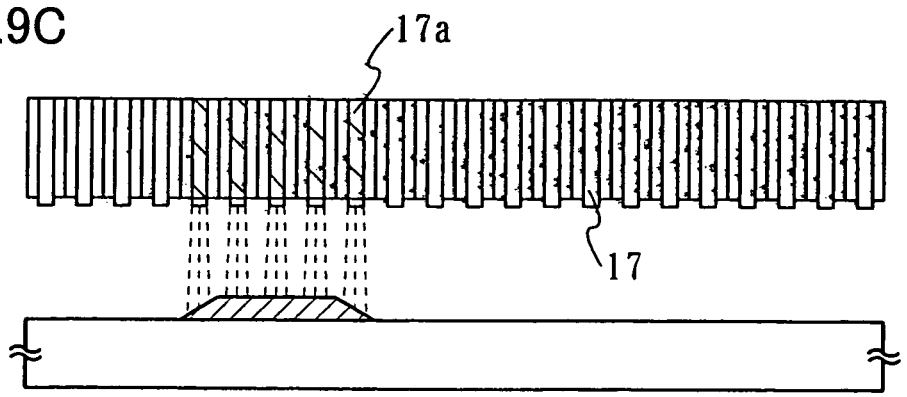

FIG. 9D is a process to remove the mask pattern 14, and a film removing means where a plurality of discharging ports for plasma is arranged in a uniaxial direction to remove a film is used. In a nozzle body 17, an oxygen plasma treatment is performed to perform ashing, but it is not necessary that the treatment is performed on the entire surface of the substrate. A nozzle body 17a only around a region where the mask pattern is formed may be operated so that the treatment is performed selectively.

Figure 10A:
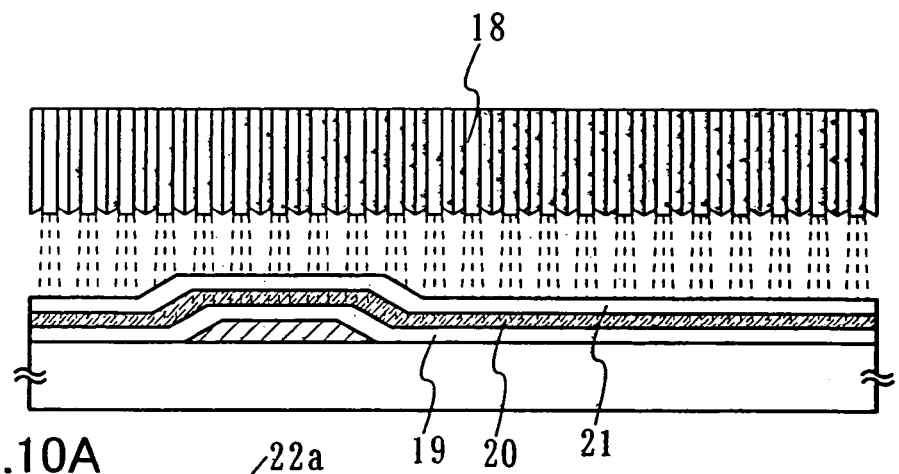
FIG. 10A to FIG. 10D are sectional views to describe a manufacturing process of a display device of the present invention.

In FIG. 10A, a gate insulating film 19, a non-single crystal silicon film 20 and a protective film 21 are formed. To form a laminate product of these, a plurality of nozzle bodies 18 that handle formation of each film may be prepared so that the film is formed continuously, or the lamination may be formed sequentially by changing gas species every time the nozzle body 18 is scanned. Since the region where a film is to be formed is not the entire surface of a substrate 10, a reactive gas in a plasma state may be supplied from the whole area of the nozzle body 18 only to the region where TFT is to be formed, for example, so that a film is formed. In the case of forming a silicon oxide film, an oxide gas of silane and oxygen or the like may be used, or there is also an option of using TEOS. A gate insulating film 19 may be formed on the entire surface of the substrate, or formed selectively around a region where TFT is to be formed, of course.

Figure 10B:
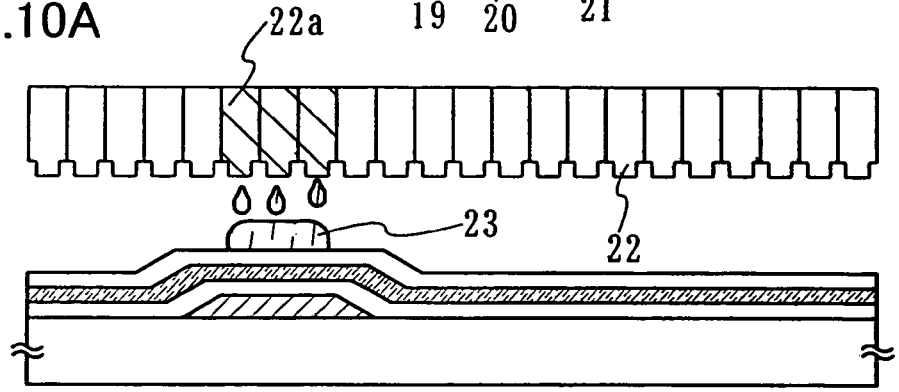

FIG. 10B is a process to form a mask pattern 23. The mask pattern 23 for forming a protective film of a channel part is formed by discharging a resist composition selectively by a selected head 22a of a droplet discharging means 22 where a plurality of discharge outlets for a composition is arranged in a uniaxial direction.

Figure 10C:
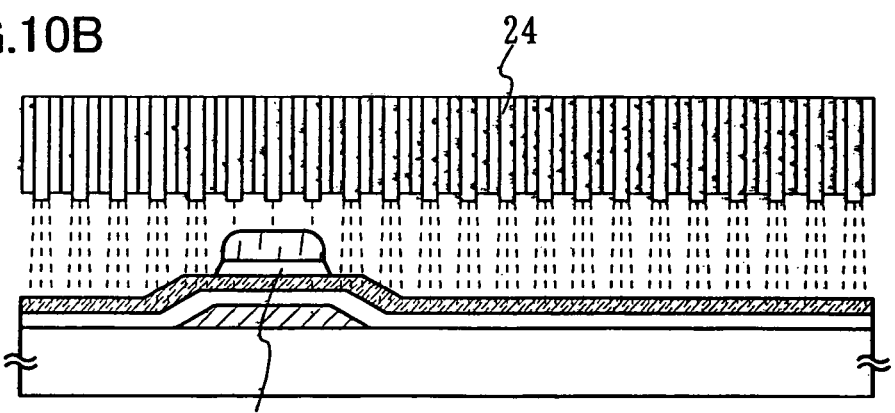

FIG. 10C is a process to form a protective film 25 of a channel part by performing etching of the protective film 21 by a nozzle body 24, using the mask pattern 23. The channel protective film formed of a silicon nitride film may be performed by using a fluoride gas such as $SF_6$.

After that, the mask pattern 23 is removed in the same way as the case of FIG. 9D by the film removing means.

Figure 10D:
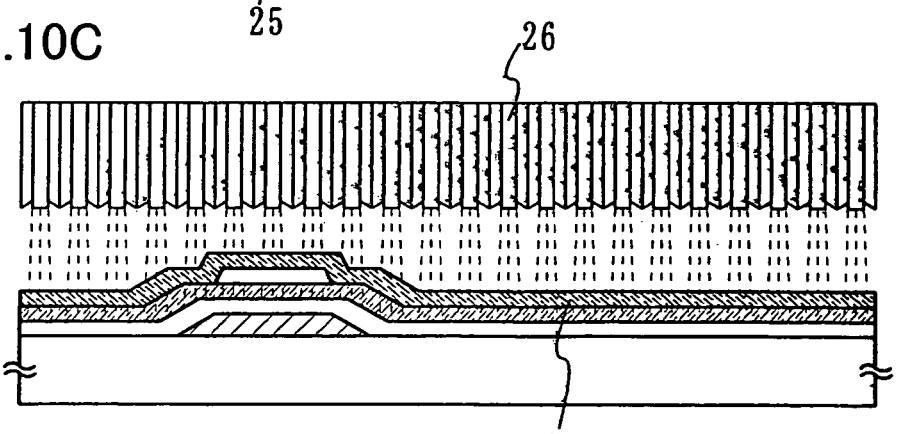

FIG. 10D is a process to form a non-single crystal silicon film 27 of one conductivity type for forming a source and a drain of TFT. Typically it is formed of n-type non-single crystal silicon, and the reactive gas supplied from a nozzle body 26 may be a siliconized gas such as silane combined with a gas that includes a periodic law 15th family element typified by phosphine.

Figure 11A:
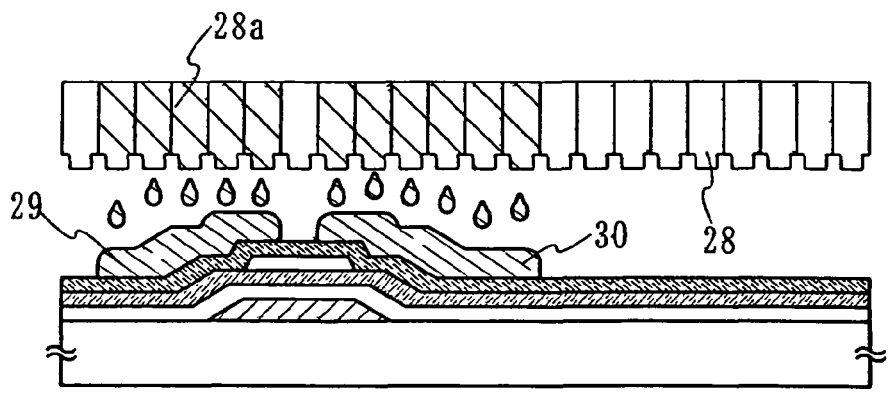
FIG. 11A to FIG. 11D are sectional views to describe a manufacturing process of a display device of the present invention.

FIG. 11A is a process to form source and drain wirings 29 and 30 by coating a conductive paste. A droplet discharging means 28 may use a structure in which droplets are discharged by using piezoelectric elements, or may use a dispenser method. In both cases, a conductive composition that includes metal microparticles whose size is approximately 1 μm is selectively dropped by a selected head 28a of the droplet discharging means 28, so that a pattern of the source and drain wirings 29 and 30 is formed directly. Or, a conductive polymer composition in which metal microparticles whose size is approximately 1 μm and ultrafine particles of nanosize are dispersed may be used. By using this, there is a significant effect that contact resistance with the non-single crystal silicon film 27 of one conductivity type can be reduced. After that, in order to harden the wiring pattern by volatilizing a solvent of the composition, for heating, a heated inert gas may be blown from a nozzle body in the same way, or a halogen lamp heater may be used to heat.

Figure 11B:
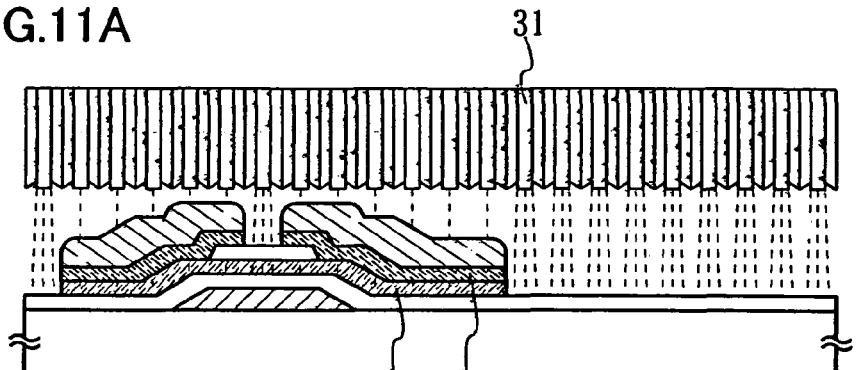

In FIG. 11B, using the formed source and drain wirings 29 and 30 as masks, etching of the non-single crystal silicon film 27 of one conductivity type and the non-single crystal silicon film 20 that are placed in the under side of the source and drain wirings 29 and 30 is performed. The etching is performed by emitting a fluoride gas in a plasma state from a nozzle body 31. In this case, in the amount of a reactive gas blown, the amount of spraying is different between a region around a place the wiring is formed and the other region. By spraying the gas in large quantity for a region where the non-single crystal silicon film is exposed, the balance of etching can be kept, and the consumption of the reactive gas can be controlled.

Figure 11C:
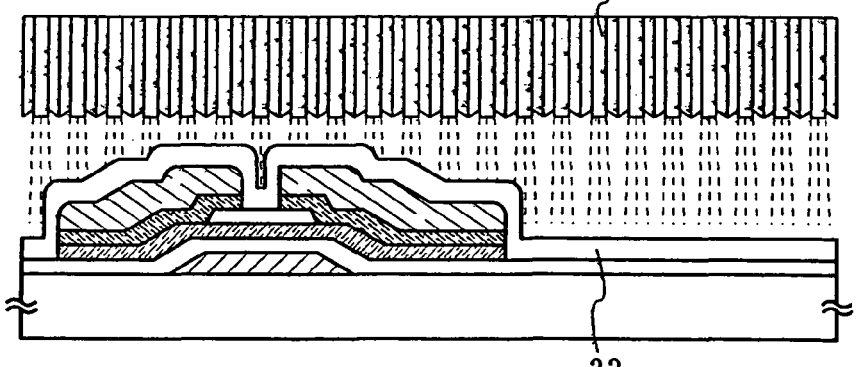

FIG. 11C is a process to form a protective film on the entire surface. By spouting a reactive gas in a plasma state from a nozzle body 32, typically, a silicon nitride film 33 is formed.

Figure 11D:
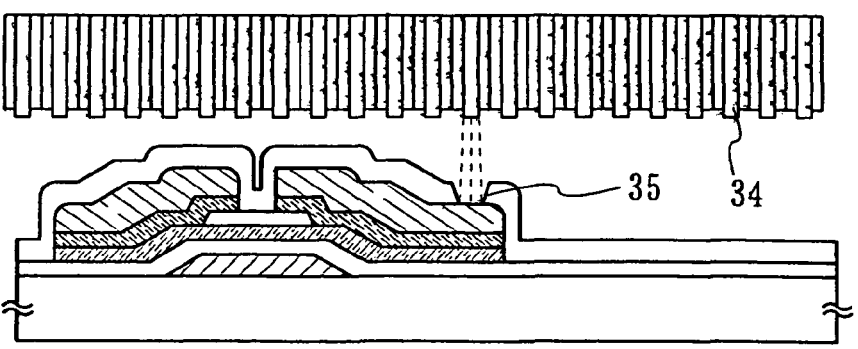

FIG. 11D is a process to form a contact hole. By spouting a reactive gas in a plasma state selectively on a place where a contact hole is to be formed, using a nozzle body 34, a contact hole 35 can be formed without a mask.

Figure 12:
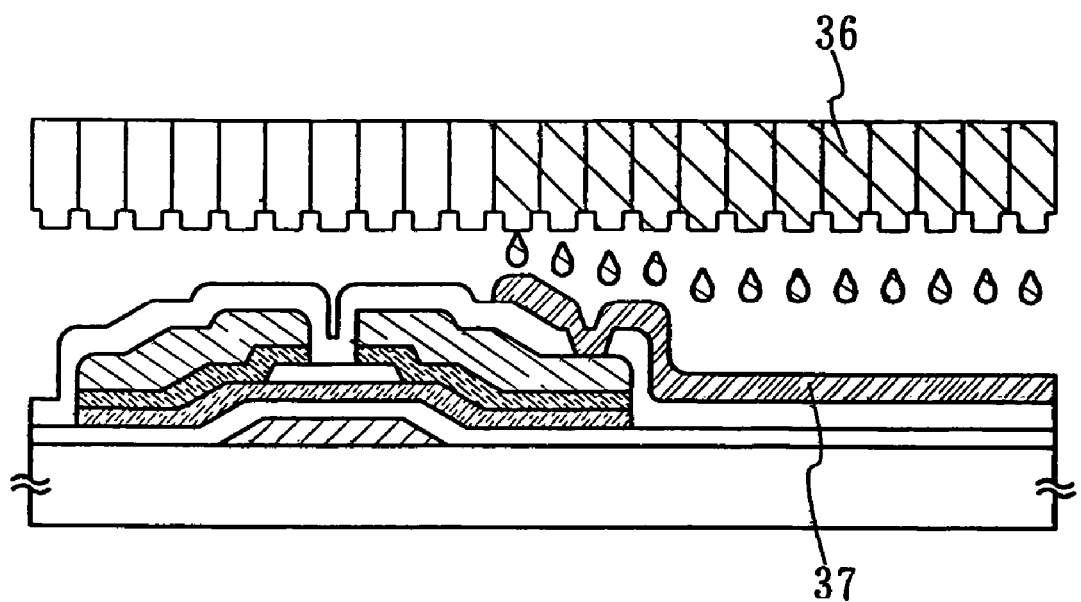
FIG. 12 is a sectional view to describe a manufacturing process of a display device of the present invention.

After that, as shown in FIG. 12, a pixel electrode 37 is formed by a printing method. This is formed by making a predetermined pattern of a composition including conductive fine particles of indium tin oxide, tin oxide, zinc oxide or the like on a substrate directly, using a droplet discharging means 36. By using a composition of conductive polymer with particles of indium tin oxide dispersed, as the composition above, especially, resistance in the contact part with the non-single crystal silicon film 27 of one conductivity type can be reduced. In this process, the pixel electrode is formed.

By the following process, an element substrate that is one of the substrates to form a display device of active matrix type where a switching element of TFT is placed for each pixel can be manufactured, without using a conventional photolithography process.

As the other embodiment mode of the present invention, TFT and a display device using TFT can be manufactured without using a mask pattern for which a resist composition is used, by using the pattern drawing means, the film forming means, the film removing means that are structured as described in FIG. 4 to FIG. 8.

Figure 13A:
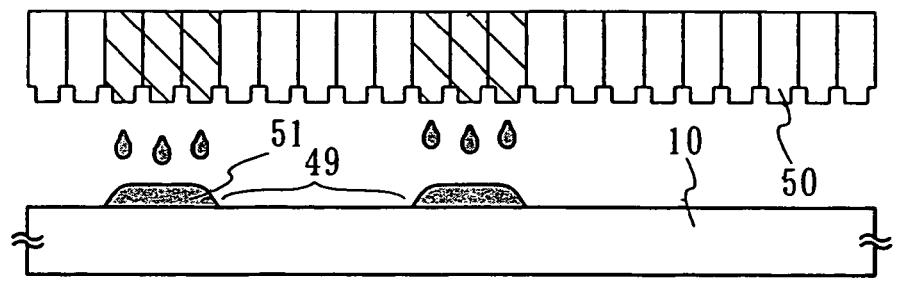
FIG. 13A to FIG. 13D are sectional views to describe a manufacturing process of a display device of the present invention.
Figure 13B:
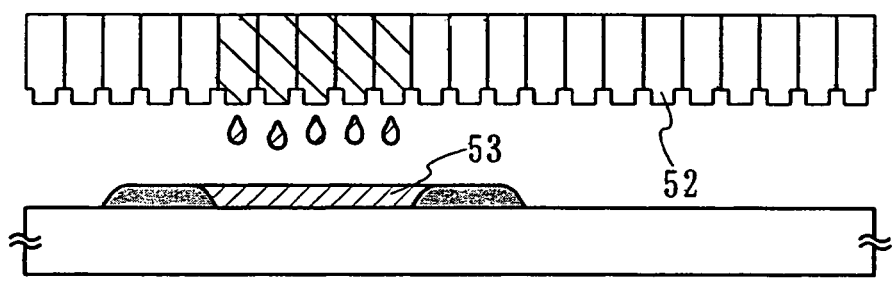

In FIG. 13A, a bank 51 comprising an insulating resin material is formed on a substrate 10 by using a droplet discharging means 50. As shown in FIG. 13B, the bank 51 having an opening part 49 is used for forming a gate electrode 53 by a droplet discharging means 52. That is, the bank 51 works as a bulkhead that prevents a composition from spreading peripherally when the conductive composition is discharged on the opening part 49, so that a predetermined pattern is formed.

Figure 13C:
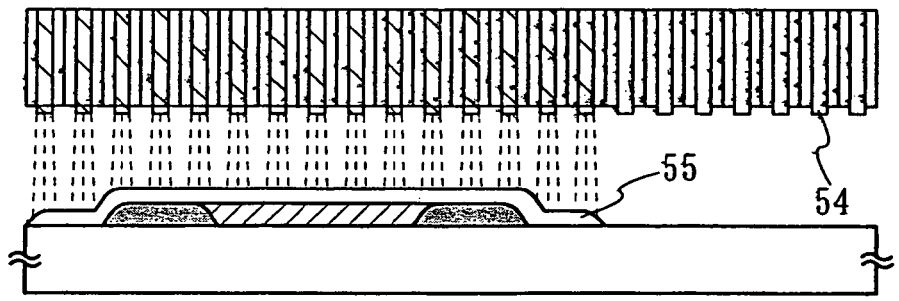
Figure 13D:
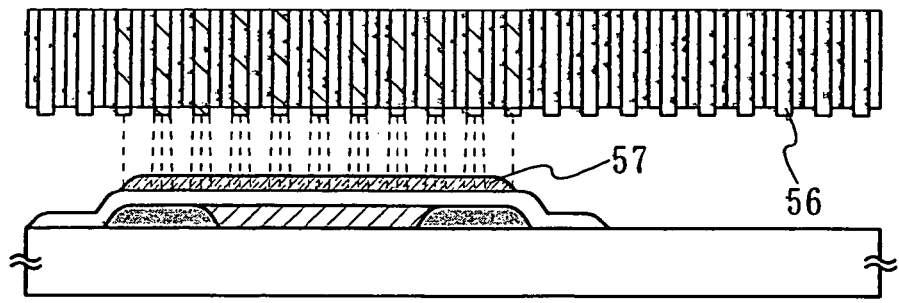

FIG. 13C is a process to form a gate insulating film, and a gate insulating film 55 is formed on the gate electrode 53, using a nozzle body 54. After that, a semiconductor film 57 is formed by atmospheric pressure plasma using a nozzle body 56, as shown in FIG. 13D.

Figure 14A:
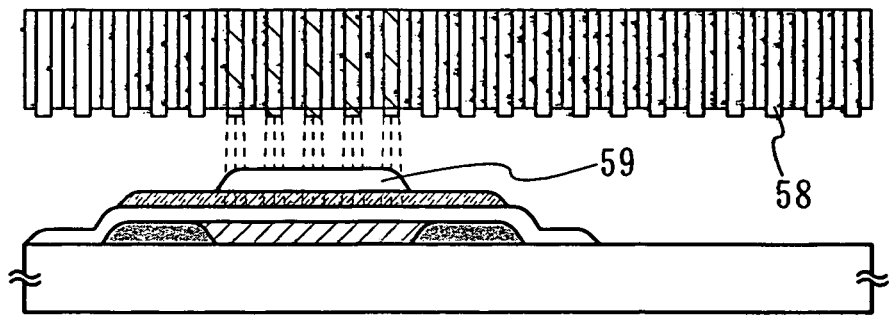
FIG. 14A to FIG. 14D are sectional views to describe a manufacturing process of a display device of the present invention.

FIG. 14A is a process to form a protective film 59 on the semiconductor film 57 by atmospheric pressure plasma using a nozzle body 58, and an insulating film comprising silicon oxide, silicon nitride or the like is formed selectively. This process is unnecessary for the case of a channel etching type.

Figure 14B:
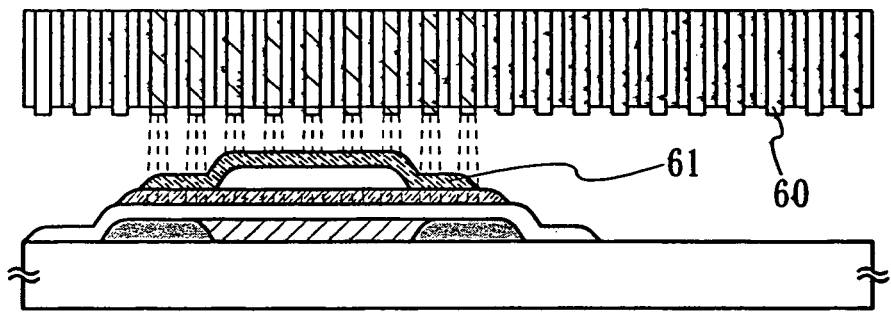

FIG. 14B is a process to form a semiconductor film 61 of one conductivity type for forming a source and a drain of TFT. By atmospheric pressure plasma CVD using a nozzle body 60, the film is formed selectively.

Figure 14C:
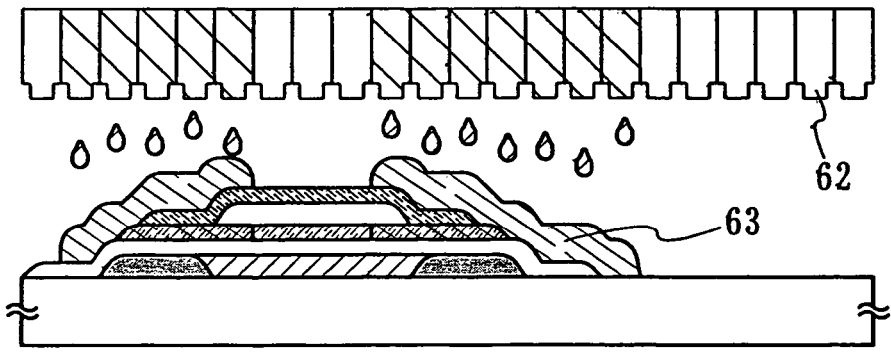

In FIG. 14C, a source and drain wiring 63 is formed by coating a conductive paste. A droplet discharging means 62 may use a structure in which droplets are discharged by using piezoelectric elements, or may use a dispenser method. In both cases, a conductive composition that includes metal microparticles whose size is approximately 1 μm is selectively dropped, so that a pattern of the source and drain wiring is formed directly. After that, in order to harden the wiring pattern by volatilizing a solvent of the composition, a heated inert gas may be blown from a nozzle body in the same way, or a halogen lamp heater may be used to heat.

Figure 14D:
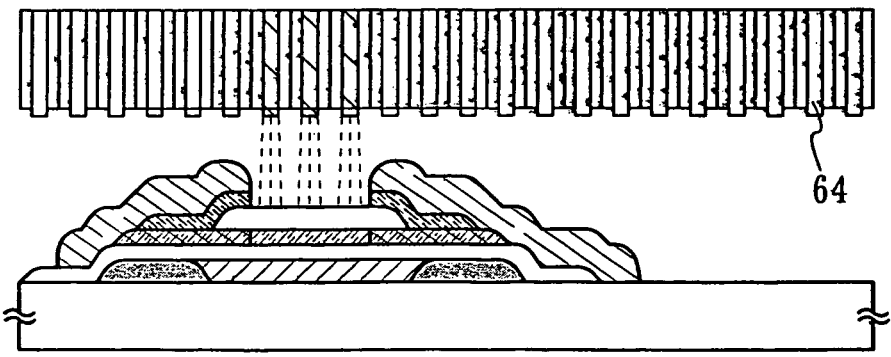

In FIG. 14D, using the formed source and drain wiring 63 as a mask, etching of the semiconductor film 61 of one conductivity type that is placed in the under side of the source and drain wiring 63 is performed. The etching is performed by emitting a fluoride gas in a plasma state from a nozzle body 64. In this case, the amount of a reactive gas blown is different between a region around a place the wiring is formed and the other region. By spraying the gas in large quantity for a region where the non-single crystal silicon film is exposed, the balance of etching can be kept, and the consumption of the reactive gas can be controlled.

Figure 15A:
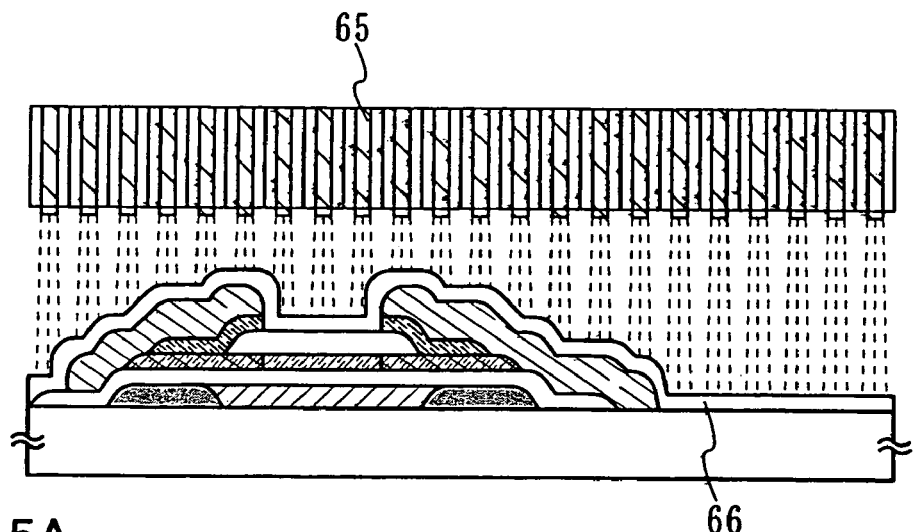
FIG. 15A to FIG. 15C are sectional views to describe a manufacturing process of a display device of the present invention.

FIG. 15A is a process to form a protective film. By spouting a reactive gas in a plasma state from a nozzle body 65, a silicon nitride film 66 is formed.

Figure 15B:
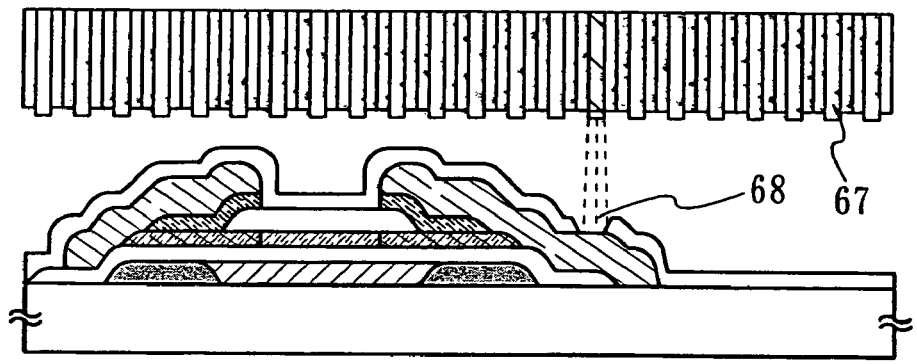

FIG. 15B is a process to form a contact hole. By spouting a reactive gas in a plasma state selectively on a place where a contact hole is to be formed, using a nozzle body 67, a contact hole 68 can be formed without a mask.

Figure 15C:
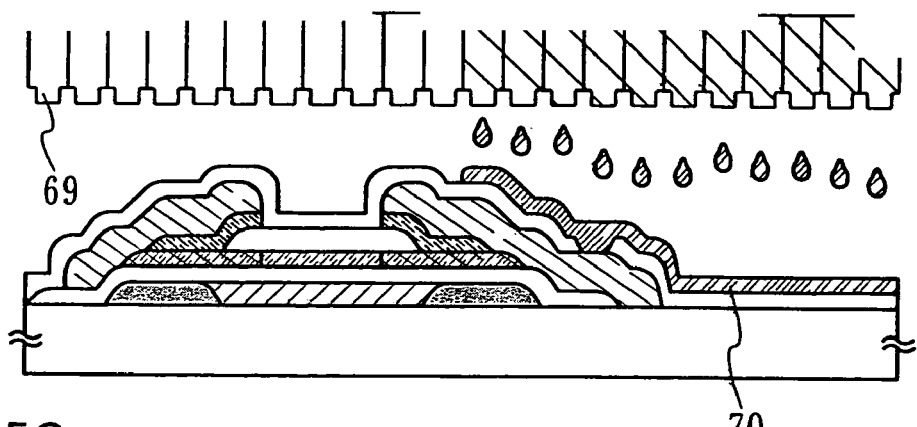

After that, as shown in FIG. 15C, a pixel electrode 70 is formed by a printing method. This is formed by making a predetermined pattern of a composition including conductive fine particles of indium tin oxide, tin oxide, zinc oxide or the like on a substrate directly, using a nozzle body 69, by a droplet discharging method. In this process, the pixel electrode can be formed.

By the following process, an element substrate that is one of the substrates to form a display device of active matrix type where a switching element of TFT is placed for each pixel can be manufactured, without using a conventional photolithography process.

FIG. 1 to FIG. 4 are drawings to describe one of embodiments of the case where the invention is applied to a roll-to-roll method in which the processes above are performed continuously. Here, the one aspect will be described, corresponding to the processes shown in FIG. 9 to FIG. 12.

Figure 1:
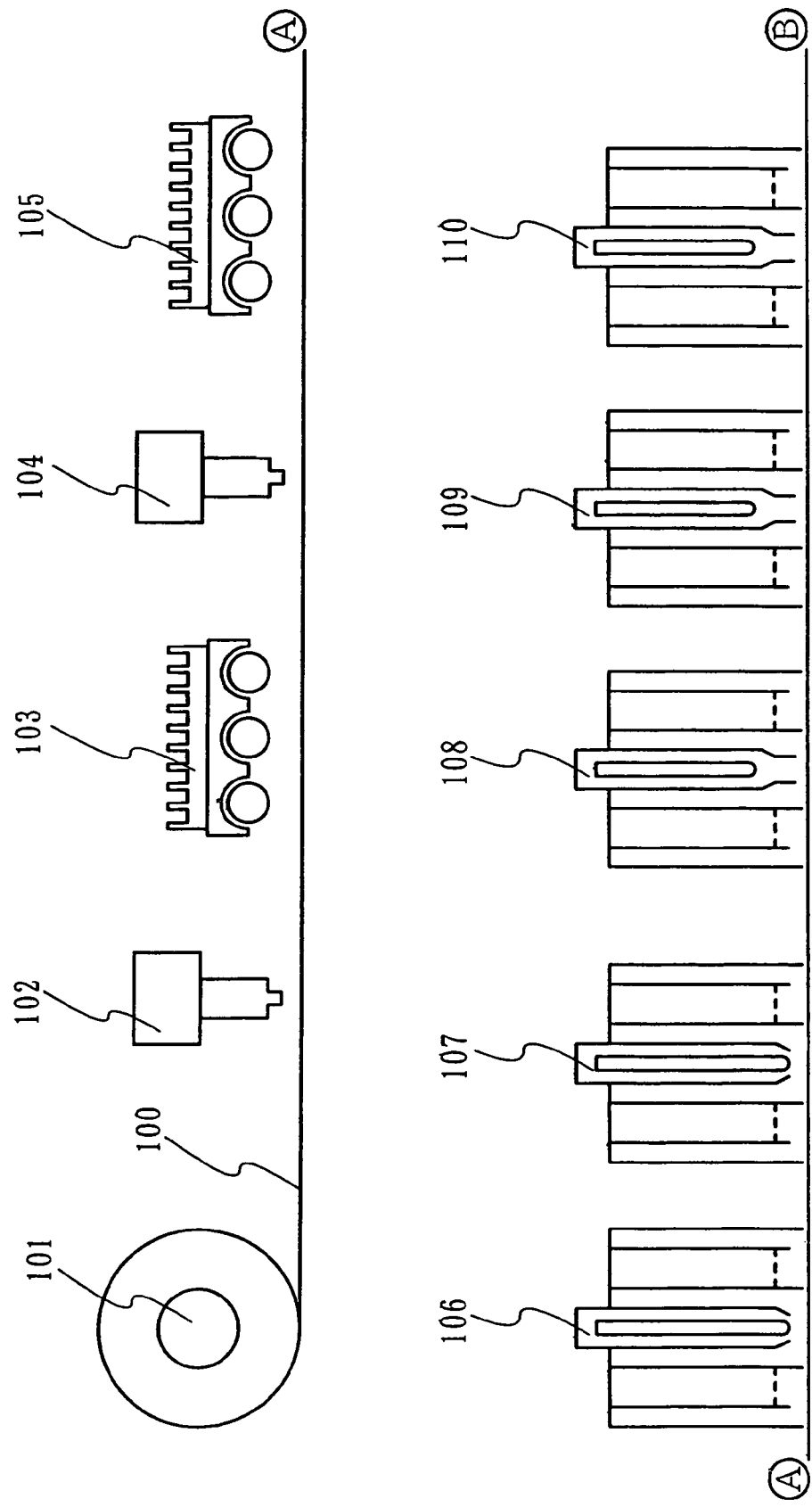
FIG. 1 is a diagram to show a manufacturing process of a display device of the present invention, and it is a diagram showing an example using a roll-to-roll method.

As shown in FIG. 1, a long sheet of flexible substrate 100 is sent from a roll in a wind-off side 101 sequentially, and after that, a metal film is formed by a droplet discharging means 102 and a heating means 103. For the heating means 103, a lamp heater and a heater of gas-heating type can be used. After that, a mask pattern is formed by a droplet discharging means 104 and a heating means 105.

After the mask pattern is formed, etching is performed by using a nozzle body 106 where a plurality of discharging ports for plasma is arranged in a uniaxial direction to remove a film, in order to form a gate electrode/wiring. A fluoride gas or a chloride gas is used for etching of a metal film. With the nozzle body, it is not necessary to spray the reactive gas on the entire surface of the substrate, and the treatment may be performed actively around the place where the metal film is removed. For removing the mask pattern, a nozzle body 107 where a plurality of discharging ports for plasma is arranged in a uniaxial direction to remove a film is used.

Formation of a gate insulating film, a non-single crystal silicon film, a protective film is performed continuously by using nozzle bodies 108, 109 and 110 where a plurality of discharging ports for plasma is arranged respectively in a uniaxial direction to form a film. Since the region where the film is to be formed is not the entire surface of the long sheet of flexible substrate 100, the film formation may be performed by supplying a reactive gas in a plasma state from the whole area of the nozzle body only on a region where TFT is to be formed, for example.

Figure 2:
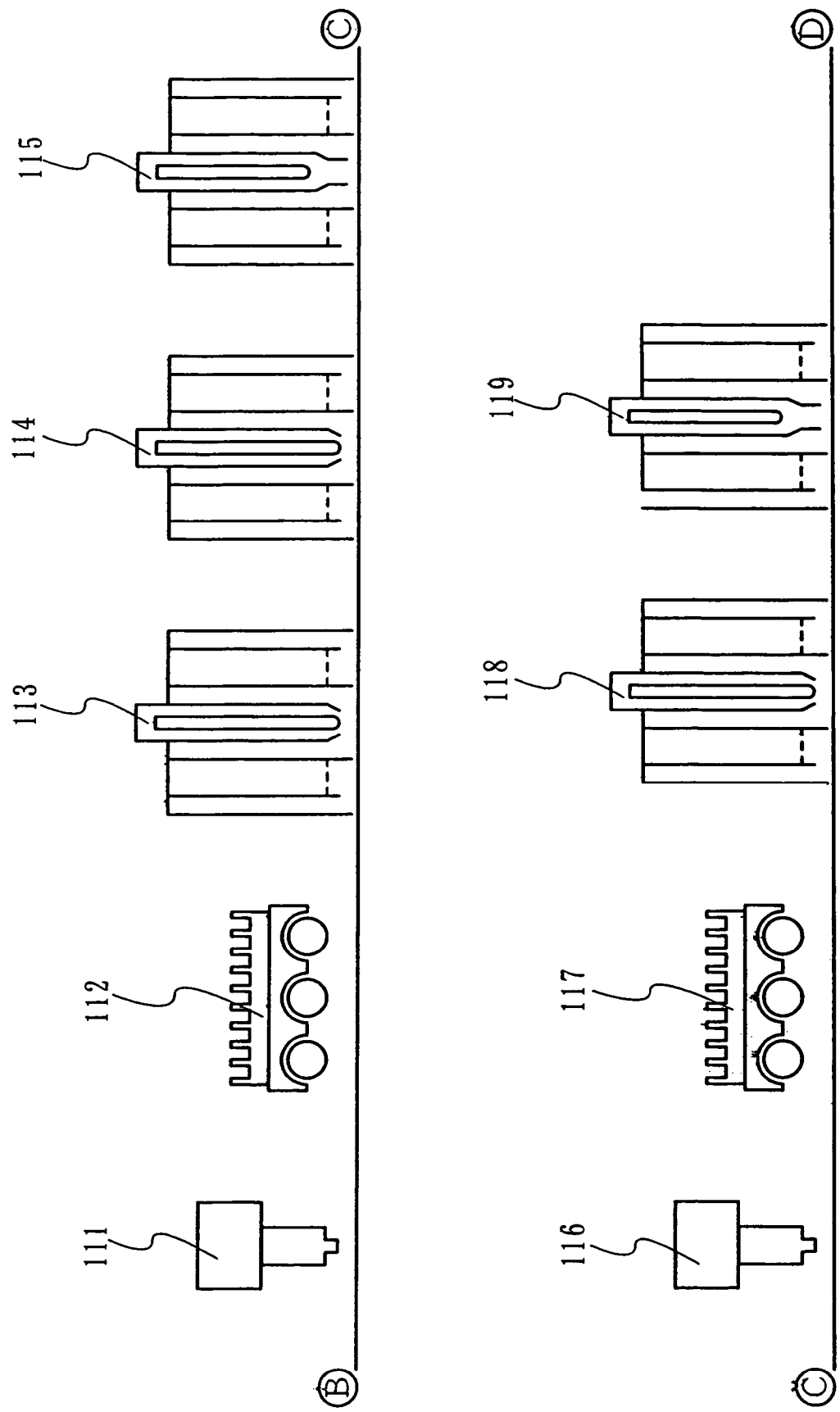
FIG. 2 is a diagram to show a manufacturing process of a display device of the present invention, and it is a diagram showing an example using a roll-to-roll method.

In FIG. 2, by discharging a resist composition selectively by using a droplet discharging means 111 where a plurality of discharge outlets for a composition is arranged in a uniaxial direction and a heating means 112, a mask pattern to form a channel protective film is formed. Etching by a nozzle body 113 where a plurality of discharging ports for plasma is arranged in a uniaxial direction to remove a film and ashing by a nozzle body 114 where a plurality of discharging ports for plasma is arranged in a uniaxial direction to remove a film are similar to the foregoing case.

After that, a non-single crystal semiconductor film of n-type is formed by a nozzle body 115 where a plurality of discharging ports for plasma is arranged in a uniaxial direction to form a film. Then, a source and drain wiring is formed by coating a conductive paste, using a droplet discharging means 116. In any case, the source and drain wiring pattern is directly formed by dropping a conductive composition including metal microparticles whose size is approximately 1 μm selectively. After that, in order to harden the wiring pattern by volatilizing a solvent of the composition, a heating means 117 is used.

Using the source and drain wiring as a mask, etching of the non-single crystal silicon film of n-type and a non-single crystal silicon film that are placed in the under side of the source and drain wiring is performed. The etching is performed by emitting a fluoride gas in a plasma state from a nozzle body 118. In this case, the amount of a reactive gas blown is different between a region around a place the wiring is formed and the other region. By spraying the gas in large quantity for a region where the non-single crystal silicon film is exposed, the balance of etching can be kept, and the consumption of the reactive gas can be controlled.

As a process to form a protective film on the entire surface, a reactive gas in a plasma state is spouted from a nozzle body 119 so that a silicon nitride film is formed.

Figure 3:
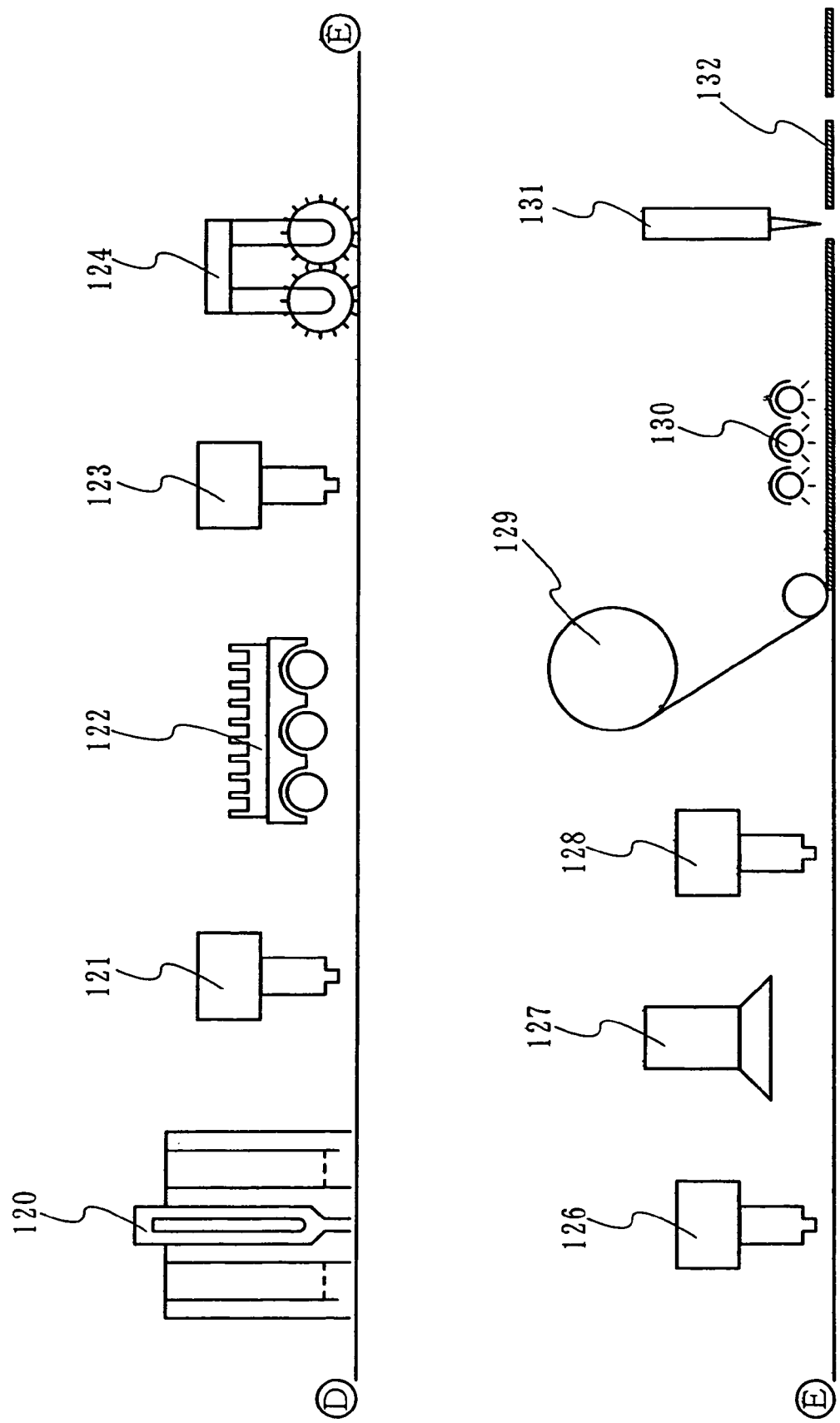
FIG. 3 is a diagram to show a manufacturing process of a display device of the present invention, and it is a diagram showing an example using a roll-to-roll method.

After that, in FIG. 3, by spouting a reactive gas in a plasma state selectively on the place where a contact hole is to be formed, using a nozzle body 120, a contact hole can be formed without a mask.

After that, using a droplet discharging means 121 and a heating means 122, a transparent electrode is formed. This is formed by making a predetermined pattern of a composition including conductive fine particles of indium tin oxide, tin oxide, zinc oxide or the like on a substrate directly, using the droplet discharging means. In this process, the pixel electrode can be formed.

The following process is a process needed in the case of manufacturing a liquid crystal display device. In the process, an orientation film is formed by a droplet discharging means 123, and a rubbing treatment is performed by a rubbing means 124. In addition, a sealing material is drawn by a droplet discharging means 126 and spacers are dispersed by a dispersing means 127, then liquid crystal is dropped on a long sheet of flexible substrate 100 by a droplet discharging means 128.

For the opposite side, a substrate is supplied from the other wind-off roller 129, and attached. By hardening the sealing material by a hardening means 130, the two substrates are bonded together. In addition, by a dividing means 131, the substrate is cut into a panel size accordingly, so that a liquid crystal panel 132 can be manufactured.

Using a display device manufactured by such a structure, a television receiver, a computer, a picture reproducer shown in FIG. 16 as examples, or other electronic devices can be completed.

Figure 16A:
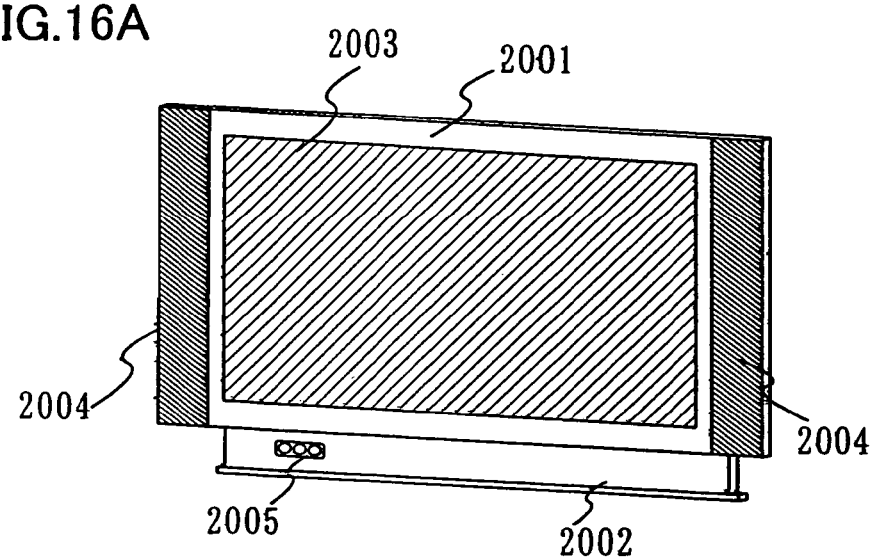
FIG. 16A to FIG. 16C are diagrams to show an aspect of a display device of the present invention.

FIG. 16A is an example of completing a television receiver, applying the present invention, and it is structured by a housing 2001, a support 2002, a display part 2003, a speaker part 2004, a video input terminal 2005 and the like. By using the present invention, especially a television receiver whose screen size is 30 inches or larger can be manufactured at low cost. Furthermore, by using a display device of the present invention, a television receiver can be completed. This is an effect of using a flexible substrate that is thinner and whose specific gravity is smaller than glass, as a substrate.

Figure 16B:
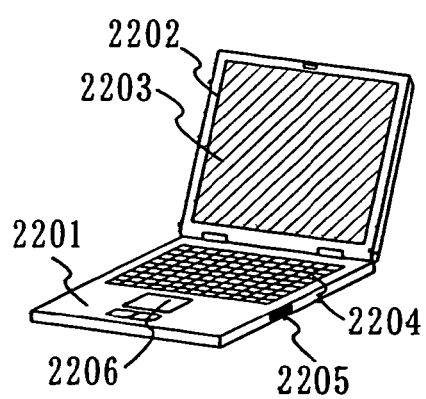

FIG. 16B is an example of completing a notebook personal computer, applying the present invention, and it is structured by a main body 2201, a housing 2202, a display part 2203, a keyboard 2204, an external connection port 2205, a pointing mouse 2206 and the like. By using the present invention, a personal computer having the display part 2203 that is 15 to 17 inches class can be manufactured at low cost.

Figure 16C:
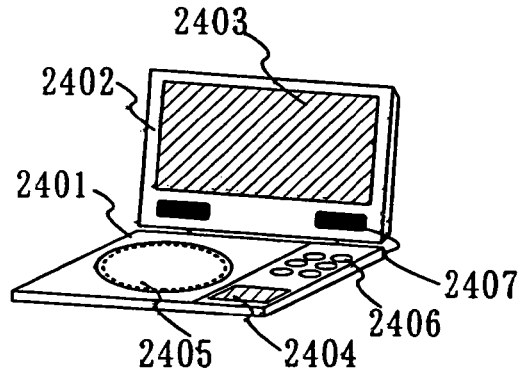

FIG. 16C is an example of completing a image reproducer, applying the present invention, and it is structured by a main body 2401, a housing 2402, a display part A 2403, a display part B 2404, a recording media reading part 2405, an operation key 2406, a speaker part 2407 and the like. By using the present invention, a image reproducer having the display part A 2403 that is 15 to 17 inches class and also being light can be manufactured at low cost.

In order to form a microscopic pattern by the embodiment modes above, a composition with metal microparticles whose average size is 1 to 50 nm, preferably 3 to 7 nm, dispersed in an organic solvent may be used. Typically, particles of silver or gold are used, and the surface is coated with a dispersing agent such as amine, alcohol and thiol. The organic solvent is phenol resin, epoxy resin or the like, and thermosetting or photo-curing one is applied. In order to modify the viscosity of the composition, a thixotropic agent or a diluting solvent may be added.

As for the composition discharged on the surface in proper quantity by a droplet discharging means, the organic solvent is hardened by a heating treatment or a light irradiation treatment. Due to the contraction in volume that accompanies the hardening of the organic solvent, the metal microparticles contact each other, and fusion, welding or aggregation is facilitated. That is, a wiring with metal microparticles whose average size is 1 to 50 nm, preferably 3 to 7 nm, fused, welded or aggregated is formed. In this way, by forming a condition where metal microparticles contact each other on their surfaces due to fusion, welding or aggregation, lower resistance of the wiring can be realized.

The present invention makes it easy to form a wiring pattern whose line width is approximately 1 to 10 μm, by forming a conductive pattern using such a composition. In addition, even when a contact hole is approximately 1 to 10 μm in diameter, the composition can fill the inside of the hole. That is, a multilayer wiring structure can be formed by a microscopic wiring pattern.

When particles of an insulating material are used instead of metal microparticles, an insulating pattern can be formed in the same way.

semiconductor film and a metal film on a predetermined region.

The invention claimed is:

1. A method for manufacturing a display device comprising:
   sending a flexible substrate from a first roll in a wind-off side;
   forming a metal film over the flexible substrate by selectively discharging a composition including a conductive material over the flexible substrate from a plurality of discharge outlets arranged in a uniaxial direction, a timing and an amount of the composition which is discharged being controlled by a plurality of heads respectively having the discharge outlet;
   forming a mask pattern over the metal film by selectively discharging a composition including a high molecular weight resin over the metal film from a plurality of discharge outlets arranged in a uniaxial direction, a timing and an amount of the composition which is discharged being controlled by a plurality of heads respectively having the discharge outlet;
   forming a gate electrode by etching the metal film by changing a gas into plasma and selectively supplying the plasma from a plurality of discharging ports arranged in a uniaxial direction to the metal film, the plurality of discharging ports being controlled independently;
   removing the mask pattern after forming the gate electrode by changing a gas into plasma and selectively supplying the plasma from a plurality of discharging ports arranged in a uniaxial direction to the mask pattern, the plurality of discharging ports being controlled independently;
   forming a film over the gate electrode by changing a gas into plasma and selectively supplying the plasma over the gate electrode from a plurality of discharging ports arranged in a uniaxial direction, the plurality of discharging ports being controlled independently; and sending an opposing substrate from a second roll so that the opposing substrate is attached to the flexible substrate.

2. The method for manufacturing the display device according to claim 1, further comprising forming a liquid crystal over the flexible substrate by a droplet discharging means.

3. The method for manufacturing the display device according to claim 1, wherein each of the step of forming the gate electrode, the step of removing the mask pattern, and the step of forming the film is performed under an atmospheric pressure or a pressure around an atmospheric pressure.

4. The method for manufacturing the display device according to claim 1, wherein a fluoride gas or a chloride gas is used for etching the metal film.

5. The method for manufacturing the display device according to claim 1, wherein the timing of the composition of the metal film, which is discharged is controlled by each of the plurality of heads in accordance with movement of the flexible substrate.

6. The method for manufacturing the display device according to claim 5, wherein the timing is based on a marker which is formed on the flexible substrate.

7. The method for manufacturing the display device according to claim 1, wherein the timing of the composition of the mask pattern, which is discharged is controlled by each of the plurality of heads in accordance with movement of the flexible substrate.

8. The method for manufacturing the display device according to claim 7, wherein the timing is based on a marker which is formed on the flexible substrate.

9. The method for manufacturing the display device according to claim 1, wherein a nozzle body where the plurality of discharging ports for removing the mask pattern are arranged includes a plasma generating means, a gas supplying means, and a gas evacuation means.

10. The method for manufacturing the display device according to claim 9, further including a gas purification means between the gas supplying means and the gas evacuation means, where a gas evacuated by the gas evacuation means is purified to be used in the gas supplying means again.

11. A method for manufacturing a display device comprising:

sending a flexible substrate from a first roll in a wind-off side;

forming a metal film over the flexible substrate by selectively discharging a composition including a conductive material over the flexible substrate from a plurality of discharge outlets arranged in a uniaxial direction, a timing and an amount of the composition which is discharged being controlled by a plurality of heads respectively having the discharge outlet;

forming a gate electrode by etching the metal film by changing a gas into plasma and selectively supplying the plasma from a plurality of discharging ports arranged in a uniaxial direction to the metal film, the plurality of discharging ports being controlled independently;

forming a first film over the gate electrode by changing a gas into plasma and selectively supplying the plasma over the gate electrode from a plurality of discharging ports arranged in a uniaxial direction, the plurality of discharging ports being controlled independently;

forming a second film over the first film by changing a gas into plasma and selectively supplying the plasma over the first film from a plurality of discharging ports arranged in a uniaxial direction, the plurality of discharging ports being controlled independently;

removing a part of the first film or the second film by changing a gas into plasma and selectively supplying the plasma from a plurality of discharging ports arranged in a uniaxial direction, the plurality of discharging ports being controlled independently; and sending an opposing substrate from a second roll so that the opposing substrate is attached to the flexible substrate.

12. The method for manufacturing the display device according to claim 11, further comprising forming a liquid crystal over the flexible substrate by a droplet discharging means.

13. The method for manufacturing the display device according to claim 11, wherein each of the step of forming the first film, the step of forming the second film, and the step of removing the part of the first film or the second film is performed under an atmospheric pressure or a pressure around an atmospheric pressure.

14. The method for manufacturing the display device according to claim 11, further comprising:

forming a mask pattern over the metal film by selectively discharging a composition including a high molecular weight resin over the metal film from a plurality of discharge outlets arranged in a uniaxial direction; and removing the mask pattern after forming the gate electrode by changing a gas into plasma and selectively supplying the plasma from a plurality of discharging ports arranged in a uniaxial direction to the mask pattern.

15. The method for manufacturing the display device according to claim 14, wherein a fluoride gas or a chloride gas is used for etching the metal film.

16. The method for manufacturing the display device according to claim 11, wherein the timing of the composition which is discharged is controlled by each of the plurality of heads in accordance with movement of the flexible substrate.

17. The method for manufacturing the display device according to claim 16, wherein the timing is based on a marker which is formed on the flexible substrate.

18. A method for manufacturing a display device comprising:

sending a flexible substrate from a first roll in a wind-off side;

forming a conductive film over the flexible substrate by selectively discharging a composition including a conductive material over the flexible substrate from a plurality of discharge outlets arranged in a uniaxial direction, a timing and an amount of the composition which is discharged being controlled by a plurality of heads respectively having the discharge outlet;

forming a gate electrode by etching the conductive film by changing a gas into plasma and selectively supplying the plasma from a plurality of discharging ports arranged in a uniaxial direction to the conductive film, the plurality of discharging ports being controlled independently;

forming an insulating film over the gate electrode by changing a gas into plasma and selectively supplying the plasma over the gate electrode from a plurality of discharging ports arranged in a uniaxial direction, the plurality of discharging ports being controlled independently;

forming a semiconductor film over the insulating film by changing a gas into plasma and selectively supplying the plasma over the insulating film from a plurality of discharging ports arranged in a uniaxial direction, the plurality of discharging ports being controlled independently;

forming a source wiring and a drain wiring by selectively discharging a composition including a conductive material over the semiconductor film from a plurality of discharge outlets arranged in a uniaxial direction, a timing and an amount of the composition which is discharged being controlled by a plurality of heads respectively having the discharge outlet; and sending an opposing substrate from a second roll so that the opposing substrate is attached to the flexible substrate.

19. The method for manufacturing the display device according to claim 18, further comprising forming a liquid crystal over the flexible substrate by a droplet discharging means.

20. The method for manufacturing the display device according to claim 18, wherein each of the step of forming the insulating film, and the step of forming the semiconductor film is performed under an atmospheric pressure or a pressure around an atmospheric pressure.

21. The method for manufacturing the display device according to claim 18, further comprising:

forming a mask pattern over the conductive film by selectively discharging a composition including a high molecular weight resin over the conductive film from a plurality of discharge outlets arranged in a uniaxial direction; and removing the mask pattern after forming the gate electrode by changing a gas into plasma and selectively supplying the plasma from a plurality of discharging ports arranged in a uniaxial direction to the mask pattern.

22. The method for manufacturing the display device according to claim 21, wherein a fluoride gas or a chloride gas is used for etching the conductive film.

23. The method for manufacturing the display device according to claim 18, wherein the timing of the composition which is discharged is controlled by each of the plurality of heads in accordance with movement of the flexible substrate.

24. The method for manufacturing the display device according to claim 23, wherein the timing is based on a marker which is formed on the flexible substrate.

25. The method for manufacturing the display device according to claim 18, wherein the source wiring and the drain wiring are formed by discharging the conductive material including metal microparticles, a size of each of the metal microparticles is approximately 1 μm.

26. A method for manufacturing a display device comprising:

sending a flexible substrate from a first roll in a wind-off side to a second roll to be reeled;

forming a metal film over the flexible substrate by selectively discharging a composition including a conductive material over the flexible substrate from a plurality of discharge outlets arranged in a uniaxial direction, a timing and an amount of the composition which is discharged being controlled by a plurality of heads respectively having the discharge outlet;

forming a mask pattern over the metal film by selectively discharging a composition including a high molecular weight resin over the metal film from a plurality of discharge outlets arranged in a uniaxial direction, a timing and an amount of the composition which is discharged being controlled by a plurality of heads respectively having the discharge outlet;

forming a gate electrode by etching the metal film by changing a gas into plasma and selectively supplying the plasma from a plurality of discharging ports arranged in a uniaxial direction to the metal film, the plurality of discharging ports being controlled independently;

removing the mask pattern after forming the gate electrode by changing a gas into plasma and selectively supplying the plasma from a plurality of discharging ports arranged in a uniaxial direction to the mask pattern, the plurality of discharging ports being controlled independently; and forming a film over the gate electrode by changing a gas into plasma and selectively supplying the plasma over the gate electrode from a plurality of discharging ports arranged in a uniaxial direction, the plurality of discharging ports being controlled independently, wherein forming the metal film, forming the mask pattern, forming the gate electrode, removing the mask pattern and forming the film are performed while sending the flexible substrate wound off from the first roll to the second roll to be reeled.

27. The method for manufacturing the display device according to claim 26, further comprising forming a liquid crystal over the flexible substrate by a droplet discharging means.

28. The method for manufacturing the display device according to claim 26, wherein each of the step of forming the gate electrode, the step of removing the mask pattern, and the step of forming the film is performed under an atmospheric pressure or a pressure around an atmospheric pressure.

29. The method for manufacturing the display device according to claim 26, wherein a fluoride gas or a chloride gas is used for etching the metal film.

30. The method for manufacturing the display device according to claim 26, wherein the timing of the composition of the metal film, which is discharged is controlled by each of the plurality of heads in accordance with movement of the flexible substrate.

31. The method for manufacturing the display device according to claim 30, wherein the timing is based on a marker which is formed on the flexible substrate.

32. The method for manufacturing the display device according to claim 16, wherein the timing of the composition of the mask pattern, which is discharged is controlled by each of the plurality of heads in accordance with movement of the flexible substrate.

33. The method for manufacturing the display device according to claim 32, wherein the timing is based on a marker which is formed on the flexible substrate.

34. The method for manufacturing the display device according to claim 26, wherein a nozzle body where the plurality of discharging ports for removing the mask pattern are arranged includes a plasma generating means, a gas supplying means, and a gas evacuation means.

35. The method for manufacturing the display device according to claim 34, further including a gas purification means between the gas supplying means and the gas evacuation means, where a gas evacuated by the gas evacuation means is purified to be used in the gas supplying means again.

36. A method for manufacturing a display device comprising:

sending a flexible substrate from a first roll in a wind-off side to a second roll to be reeled;

forming a metal film over the flexible substrate by selectively discharging a composition including a conductive material over the flexible substrate from a plurality of discharge outlets arranged in a uniaxial direction, a timing and an amount of the composition which is discharged being controlled by a plurality of heads respectively having the discharge outlet;

forming a gate electrode by etching the metal film by changing a gas into plasma and selectively supplying the plasma from a plurality of discharging ports arranged in a uniaxial direction to the metal film, the plurality of discharging ports being controlled independently;

forming a first film over the gate electrode by changing a gas into plasma and selectively supplying the plasma over the gate electrode from a plurality of discharging ports arranged in a uniaxial direction, the plurality of discharging ports being controlled independently;

forming a second film over the first film by changing a gas into plasma and selectively supplying the plasma over the first film from a plurality of discharging ports arranged in a uniaxial direction, the plurality of discharging ports being controlled independently; and removing a part of the first film or the second film by changing a gas into plasma and selectively supplying the plasma from a plurality of discharging ports arranged in a uniaxial direction, the plurality of discharging ports being controlled independently, wherein forming the metal film, forming the gate electrode, forming the first film, forming the second film, and removing the part of the first film or the second film are performed while sending the flexible substrate wound off from the first roll to the second roll to be reeled.

37. The method for manufacturing the display device according to claim 36, further comprising forming a liquid crystal over the flexible substrate by a droplet discharging means.

38. The method for manufacturing the display device according to claim 36, wherein each of the step of forming the first film, the step of forming the second film, and the step of removing the part of the first film or the second film is performed under an atmospheric pressure or a pressure around an atmospheric pressure.

39. The method for manufacturing the display device according to claim 36, further comprising:

forming a mask pattern over the metal film by selectively discharging a composition including a high molecular weight resin over the metal film from a plurality of discharge outlets arranged in a uniaxial direction; and removing the mask pattern after forming the gate electrode by changing a gas into plasma and selectively supplying the plasma from a plurality of discharging ports arranged in a uniaxial direction to the mask pattern.

40. The method for manufacturing the display device according to claim 39, wherein a fluoride gas or a chloride gas is used for etching the metal film.

41. The method for manufacturing the display device according to claim 36, wherein the timing of the composition which is discharged is controlled by each of the plurality of heads in accordance with movement of the flexible substrate.

42. The method for manufacturing the display device according to claim 41, wherein the timing is based on a marker which is formed on the flexible substrate.

43. A method for manufacturing a display device comprising:

sending a flexible substrate from a first roll in a wind-off side to a second roll to be reeled;

forming a conductive film over the flexible substrate by selectively discharging a composition including a conductive material over the flexible substrate from a plurality of discharge outlets arranged in a uniaxial direction, a timing and an amount of the composition which is discharged being controlled by a plurality of heads respectively having the discharge outlet;

forming a gate electrode by etching the conductive film by changing a gas into plasma and selectively supplying the plasma from a plurality of discharging ports arranged in a uniaxial direction to the conductive film, the plurality of discharging ports being controlled independently;

forming an insulating film over the gate electrode by changing a gas into plasma and selectively supplying the plasma over the gate electrode from a plurality of discharging ports arranged in a uniaxial direction, the plurality of discharging ports being controlled independently;

forming a semiconductor film over the insulating film by changing a gas into plasma and selectively supplying the plasma over the insulating film from a plurality of discharging ports arranged in a uniaxial direction, the plurality of discharging ports being controlled independently; and forming a source wiring and a drain wiring by selectively discharging a composition including a conductive material over the semiconductor film from a plurality of discharge outlets arranged in a uniaxial direction, a timing and an amount of the composition which is discharged being controlled by a plurality of heads respectively having the discharge outlet, wherein forming the gate electrode, forming the insulating film, forming the semiconductor film, and forming the source wiring and the drain wiring are performed while sending the flexible substrate wound off from the first roll to the second roll to be reeled.

44. The method for manufacturing the display device according to claim 43, further comprising forming a liquid crystal over the flexible substrate by a droplet discharging means.

45. The method for manufacturing the display device according to claim 43, wherein each of the step of forming the insulating film, and the step of forming the semiconductor film is performed under an atmospheric pressure or a pressure around an atmospheric pressure.

46. The method for manufacturing the display device according to claim 43, further comprising:

forming a mask pattern over the conductive film by selectively discharging a composition including a high molecular weight resin over the conductive film from a plurality of discharge outlets arranged in a uniaxial direction; and removing the mask pattern after forming the gate electrode by changing a gas into plasma and selectively supplying the plasma from a plurality of discharging ports arranged in a uniaxial direction to the mask pattern.

47. The method for manufacturing the display device according to claim 46, wherein a fluoride gas or a chloride gas is used for etching the conductive film.

48. The method for manufacturing the display device according to claim 43, wherein the timing of the composition which is discharged is controlled by each of the plurality of heads in accordance with movement of the flexible substrate.

49. The method for manufacturing the display device according to claim 48, wherein the timing is based on a marker which is formed on the flexible substrate.

50. The method for manufacturing the display device according to claim 43, wherein the source wiring and the drain wiring are formed by discharging the conductive material including metal microparticles, a size of each of the metal microparticles is approximately 1 µm.

* * * * *

UNITED STATES PATENT AND TRADEMARK OFFICE
CERTIFICATE OF CORRECTION

PATENT NO.      : 7,736,955 B2                      Page 1 of 1
APPLICATION NO. : 11/650565
DATED           : June 15, 2010
INVENTOR(S)     : Shunpei Yamazaki et al.

It is certified that error appears in the above-identified patent and that said Letters Patent is hereby corrected as shown below:

Column 12, lines 30 and 31, "semiconductor film and a metal film on a predetermined region" should be omitted.

Signed and Sealed this
Eleventh Day of January, 2011

David J. Kappos
*Director of the United States Patent and Trademark Office*